(12) United States Patent
Hush et al.

(10) Patent No.: US 10,936,235 B2
(45) Date of Patent: Mar. 2, 2021

(54) APPARATUSES AND METHODS FOR DATA MOVEMENT

(71) Applicant: Micron Technology, Inc., Boise, ID (US)

(72) Inventors: Glen E. Hush, Boise, ID (US); David L. Pinney, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/519,783

(22) Filed: Jul. 23, 2019

(65) Prior Publication Data
US 2019/0347031 A1 Nov. 14, 2019

Related U.S. Application Data

(62) Division of application No. 15/553,920, filed as application No. PCT/US2016/020834 on Mar. 4, 2016, now Pat. No. 10,365,851.

(Continued)

(51) Int. Cl.
*G11C 7/00* (2006.01)
*G06F 3/06* (2006.01)
(Continued)

(52) U.S. Cl.
CPC .......... *G06F 3/0647* (2013.01); *G06F 3/0604* (2013.01); *G06F 3/0673* (2013.01);
(Continued)

(58) Field of Classification Search
CPC .... G11C 7/02; G11C 7/18; G11C 7/06; G11C 11/4097; H01L 11/4091
(Continued)

(56) References Cited

U.S. PATENT DOCUMENTS 4,380,046 A 4/1983 Fung
4,435,792 A 3/1984 Bechtolsheim
(Continued)

FOREIGN PATENT DOCUMENTS

CN 102141905 8/2011
CN 104064214 9/2014
(Continued)

OTHER PUBLICATIONS

Draper et al., "A Prototype Processing-In-Memory (PIM) Chip for the Data-Intensive Architecture (DIVA) System", Journal of VLSI Signal Processing Systems for Signal, Image, and Video Technology, vol. 40, Issue 1, May 1, 2005, pp. 73-84.
(Continued)

*Primary Examiner* — Son T Dinh
(74) *Attorney, Agent, or Firm* — Brooks, Cameron & Huebsch, PLLC

(57) ABSTRACT

The present disclosure includes apparatuses and methods for data movement. An example apparatus comprises a memory device. The memory device includes an array of memory cells and sensing circuitry coupled to the array via a plurality of sense lines. The sensing circuitry includes a sense amplifier and a compute component coupled to a sense line and configured to implement operations. A controller in the memory device is configured to couple to the array and sensing circuitry. A shared I/O line in the memory device is configured to couple a source location to a destination location.

18 Claims, 8 Drawing Sheets

Related U.S. Application Data

(60) Provisional application No. 62/132,058, filed on Mar. 12, 2015.

(51) Int. Cl.

| | | |
|---|---|---|
| *G11C 5/02* | (2006.01) | |
| *G11C 7/06* | (2006.01) | |
| *G11C 7/10* | (2006.01) | |
| *G11C 11/4091* | (2006.01) | |
| *G11C 11/4093* | (2006.01) | |
| *G11C 11/4094* | (2006.01) | |
| *G11C 11/4097* | (2006.01) | |
| *G11C 11/408* | (2006.01) | |
| *G11C 11/4096* | (2006.01) | |

(52) U.S. Cl.
CPC .............. *G11C 5/025* (2013.01); *G11C 7/06* (2013.01); *G11C 7/065* (2013.01); *G11C 7/1006* (2013.01); *G11C 7/1012* (2013.01); *G11C 11/4091* (2013.01); *G11C 11/4093* (2013.01); *G11C 11/4094* (2013.01); *G11C 11/4097* (2013.01); *G11C 11/4087* (2013.01); *G11C 11/4096* (2013.01); *G11C 2207/10* (2013.01); *G11C 2207/104* (2013.01)

(58) Field of Classification Search
USPC ....................................................... 365/205
See application file for complete search history.

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,040,149 A | 8/1991 | Ebihara et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,818,785 A | 10/1998 | Ohshima |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,130,852 A | 10/2000 | Ohtani et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,212,121 B1 | 4/2001 | Ryu et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,339,817 B1 | 1/2002 | Maesako et al. |
| 6,389,507 B1 | 5/2002 | Sherman |
| 6,418,063 B1 | 7/2002 | Seitsinger et al. |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazarichuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,336,516 B2 | 2/2008 | Tran et al. |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |

(56) References Cited

U.S. PATENT DOCUMENTS

| | | |
|---|---|---|
| 7,936,634 B2 | 5/2011 | Chen et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,279,692 B2 | 10/2012 | Matsui |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,406,033 B2 | 3/2013 | Lung et al. |
| 8,417,921 B2 | 4/2013 | Gonion et al. |
| 8,462,532 B1 | 6/2013 | Argyres |
| 8,473,809 B2 | 6/2013 | Wan et al. |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,135,982 B2 | 9/2015 | Schaefer et al. |
| 9,165,023 B2 | 10/2015 | Moskovich et al. |
| 9,298,545 B2 | 3/2016 | Ratnam et al. |
| 9,607,667 B1 | 3/2017 | Lee et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0132457 A1 | 7/2003 | Lee et al. |
| 2003/0167426 A1 | 9/2003 | Slobodnik |
| 2003/0222879 A1 | 12/2003 | Lin et al. |
| 2004/0017691 A1 | 1/2004 | Luk et al. |
| 2004/0066671 A1 | 4/2004 | Scheuerlein et al. |
| 2004/0073592 A1 | 4/2004 | Kim et al. |
| 2004/0073773 A1 | 4/2004 | Demjanenko |
| 2004/0085835 A1 | 5/2004 | Ahn et al. |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0109904 A1 | 5/2007 | Hong et al. |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2008/0291760 A1 | 11/2008 | Ito et al. |
| 2009/0067218 A1 | 3/2009 | Graber |
| 2009/0154238 A1 | 6/2009 | Lee |
| 2009/0154273 A1 | 6/2009 | Borot et al. |
| 2009/0207679 A1 | 8/2009 | Takase |
| 2009/0231944 A1 | 9/2009 | Faue |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0002169 A1 | 1/2011 | Li et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2013/0343140 A1 | 12/2013 | Sabbah |
| 2014/0185395 A1 | 7/2014 | Seo |
| 2014/0215185 A1 | 7/2014 | Danielsen |

(56) References Cited

U.S. PATENT DOCUMENTS

| | | |
|---|---|---|
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1* | 2/2015 | Manning ............... G06F 3/0611 326/38 |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0247549 A1 | 8/2016 | Takagiwa |
| 2016/0307609 A1 | 10/2016 | Harris et al. |

FOREIGN PATENT DOCUMENTS

| | | |
|---|---|---|
| EP | 0214718 | 3/1987 |
| EP | 1282130 | 2/2003 |
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| TW | 201101329 | 1/2011 |
| TW | 201303595 | 1/2013 |
| TW | I454910 | 10/2014 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Extended European Search Report for related EP Application No. 16762198.6, dated Sep. 5, 2018, 9 pages.

Boyd et al., "On the General Applicability of Instruction-Set Randomization", Jul.-Sep. 2010, (14 pgs.), vol. 7, Issue 3, IEEE Transactions on Dependable and Secure Computing.

Stojmenovic, "Multiplicative Circulant Networks Topological Properties and Communication Algorithms", (25 pgs.), Discrete Applied Mathematics 77 (1997) 281-305.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi/edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performance Complex Arithmetic Functions in a Memory Device," filed Mar. 12, 2013, (23 pgs.).

International Search Report and Written Opinion for related PCT Application No. PCT/US2016/020834, dated Jun. 29, 2016, 15 pages.

Office Action for related China Patent Application No. 201680012783.2, dated Mar. 4, 2020, 18 pages.

Communication Pursuant to Article 94(3) EPC for related EP Application No. 16762198.6, dated Nov. 25, 2020, 7 pages.

\* cited by examiner

APPARATUSES AND METHODS FOR DATA MOVEMENT

PRIORITY INFORMATION

This application is a Divisional of U.S. application Ser. No. 15/553,920, filed Aug. 25, 2017, which issues as U.S. Pat. No. 10,365,851 on Jul. 30, 2019, which is a National Stage Application under 35 U.S.C. § 371 of PCT Application No. PCT/US2016/020834, having an international filing date of Mar. 4, 2016, which claims priority to U.S. Provisional Application No. 62/132,058, filed Mar. 12, 2015, the contents of which are hereby incorporated by reference in their entireties.

TECHNICAL FIELD

The present disclosure relates generally to semiconductor memory and methods, and more particularly, to apparatuses and methods for data movement.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of operations.

A number of components in an electronic system may be involved in providing instructions to the functional unit circuitry for execution. The instructions may be executed, for instance, by a processing resource such as a controller and host processor. Data (e.g., the operands on which the instructions will be executed) may be stored in a memory array that is accessible by the functional unit circuitry. The instructions and data may be retrieved from the memory array and sequenced and buffered before the functional unit circuitry begins to execute instructions on the data. Furthermore, as different types of operations may be executed in one or multiple clock cycles through the functional unit circuitry, intermediate results of the instructions and data may also be sequenced and buffered.

In many instances, the processing resources (e.g., processor and associated functional unit circuitry) may be external to the memory array, and data is accessed via a bus between the processing resources and the memory array to execute a set of instructions. Processing performance may be improved in a processor-in-memory device, in which a processor may be implemented internal and near to a memory (e.g., directly on a same chip as the memory array). A processing-in-memory device may save time by reducing and eliminating external communications and may also conserve power. However, data movement between and within banks of a processing-in-memory device may influence the data processing time of the processing-in-memory device.

DETAILED DESCRIPTION

Figure 1A:
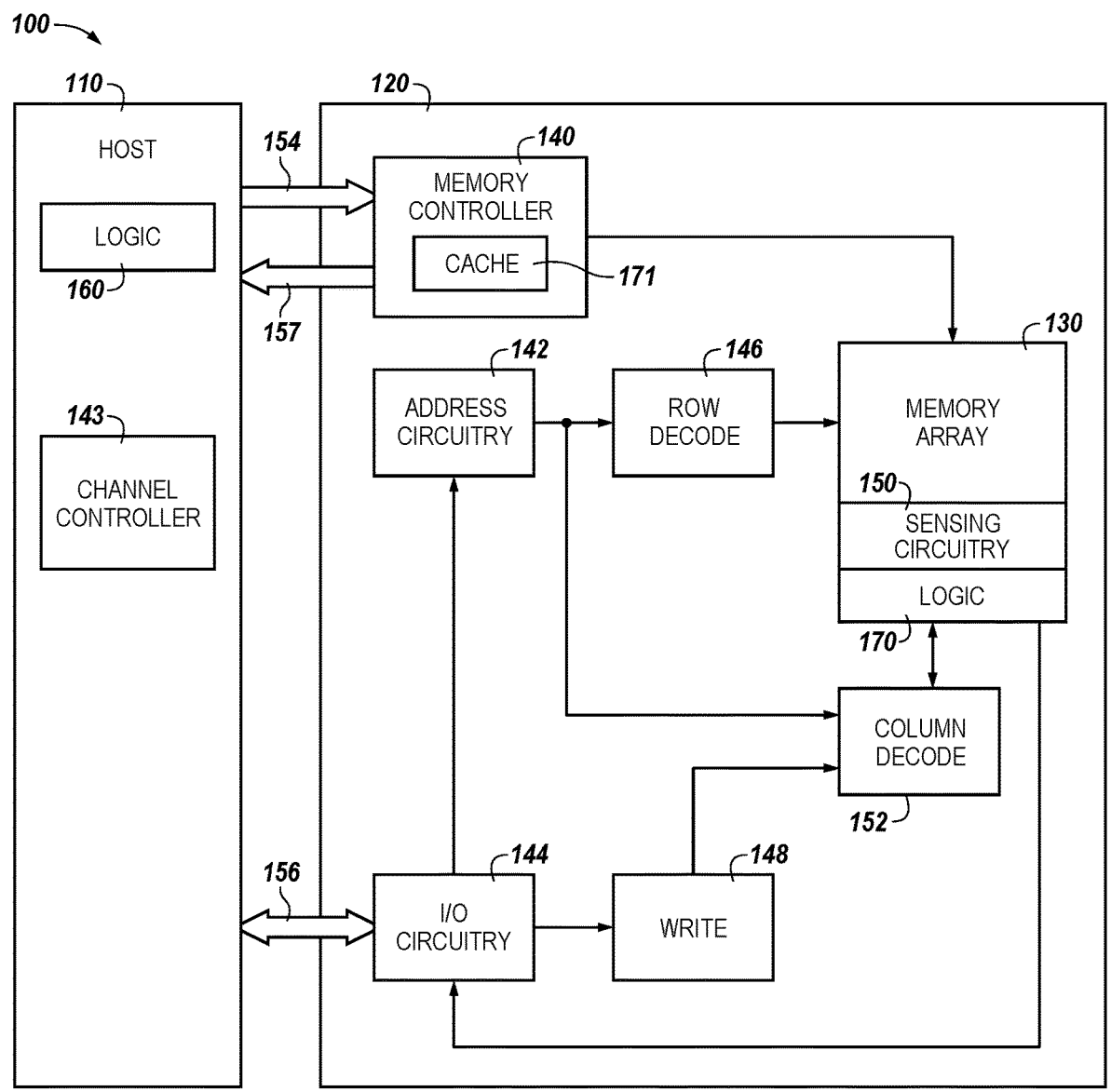
FIG. 1A is a block diagram of an apparatus in the form of a computing system including a memory device in accordance with a number of embodiments of the present disclosure.

The present disclosure includes apparatuses and methods for data movement, e.g., for processor-in-memory (PIM) structures, among other configurations described herein or otherwise. In at least one embodiment, the apparatus includes a memory device configured to couple to a host via a data bus and a control bus. A bank in the memory device includes an array of memory cells and sensing circuitry, e.g., formed on pitch with memory cells of the array, coupled to the array via a plurality of sense lines. The sensing circuitry includes a sense amplifier and a compute component coupled to a sense line and configured to implement operations. A controller in the memory device is configured to couple to the array and sensing circuitry. A shared I/O line in the memory device is configured to couple a source location to a destination location, e.g., between a pair of bank locations.

As described in more detail below, the embodiments can allow a host system to allocate a number of locations, e.g., sub-arrays (or "subarrays") and portions of subarrays, in one or more DRAM banks to hold (e.g., store) data. A host system and a controller may perform the address resolution on an entire block of program instructions, e.g., PIM command instructions, and data and direct (e.g., control) allocation and storage of data and commands into allocated locations, e.g., subarrays and portions of subarrays within a destination (e.g., target) bank. Writing data and commands may utilize a normal DRAM write path to the DRAM device. As the reader will appreciate, while a DRAM-style PIM device is discussed with regard to examples presented herein, embodiments are not limited to a PIM DRAM implementation.

Data movement between and within PIM banks, e.g., subarrays and portions of subarrays therein, may affect whether PIM operations are completed (performed) efficiently. Accordingly, the present disclosure presents structures and processes that can increase a speed, rate, and efficiency of data movement in a PIM array by using an improved data path, e.g., a shared I/O line of a DRAM implementation, as described herein.

In previous approaches, data may be transferred from the array and sensing circuitry (e.g., via a bus comprising input/output (I/O) lines) to a processing resource external to the memory array, such as a processor, microprocessor, and/or compute engine that may be located on a host, which may comprise ALU circuitry and other functional unit circuitry configured to perform the appropriate operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode 152 signal) in order to transfer data from sense lines onto I/O lines (e.g., local and global I/O lines), moving the data to a periphery of the memory array, and providing the data to the compute function.

Furthermore, the circuitry of the processing resource(s) (e.g., a compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and memory density, for example.

For example, the sensing circuitry 150 described herein can be formed on a same pitch as a pair of complementary sense lines. As an example, a pair of complementary memory cells may have a cell size with a $6F^2$ pitch (e.g., 3F×2F). If the pitch of a pair of complementary sense lines for the complementary memory cells is 3F, then the sensing circuitry being on pitch indicates the sensing circuitry (e.g., a sense amplifier and corresponding compute component per respective pair of complementary sense lines) is formed to fit within the 3F pitch of the complementary sense lines.

Furthermore, the circuitry of the processing resource(s) (e.g., a compute engine, such as an ALU) of various prior systems may not conform to pitch rules associated with a memory array. For example, the memory cells of a memory array may have a $4F^2$ or $6F^2$ cell size. As such, the devices (e.g., logic gates) associated with ALU circuitry of previous systems may not be capable of being formed on pitch with the memory cells (e.g., on a same pitch as the sense lines), which can affect chip size and/or memory density, for example. In the context of some computing systems and subsystems (e.g., a central processing unit (CPU)), data may be processed in a location that is not on pitch and/or on chip with memory (e.g., memory cells in the array), as described herein. The data may be processed by a processing resource associated with a host, for instance, rather than on pitch with the memory.

In contrast, a number of embodiments of the present disclosure can include the sensing circuitry 150 (e.g., including sense amplifiers 206 and/or compute components 231) and/or logic circuitry (e.g., 170, 213, and/or 560) being formed on pitch with the memory cells of the array. The sensing circuitry and/or logic circuitry can be configured for (e.g., capable of) performing compute functions (e.g., logical operations).

PIM capable device operations can use bit vector based operations. As used herein, the term "bit vector" is intended to mean a physically contiguous number of bits on a bit vector memory device (e.g., a PIM device) stored physically contiguous in a row of an array of memory cells. Thus, as used herein a "bit vector operation" is intended to mean an operation that is performed on a bit vector that is a contiguous portion of virtual address space (e.g., used by a PIM device). For example, a row of virtual address space in the PIM device may have a bit length of 16K bits (e.g., corresponding to 16K complementary pairs of memory cells in a DRAM configuration). Sensing circuitry 150, as described herein, for such a 16K bit row may include a corresponding 16K processing elements (e.g., compute components, as described herein) formed on pitch with the sense lines selectably coupled to corresponding memory cells in the 16 bit row. A compute component in the PIM device may operate as a one bit processing element on a single bit of the bit vector of the row of memory cells sensed by the sensing circuitry 150 (e.g., sensed by and/or stored in a sense amplifier paired with the compute component, as described herein).

A number of embodiments of the present disclosure include sensing circuitry (e.g., sense amplifiers 206) and compute circuitry (e.g., compute components 231) formed on pitch with sense lines of an array of memory cells. The sensing circuitry and compute circuitry are capable of performing data sensing and compute functions and storage, e.g., caching, of data local to the array of memory cells.

In order to appreciate the improved data movement techniques described herein, a discussion of an apparatus for implementing such techniques, e.g., a memory device having PIM capabilities and associated host, follows. According to various embodiments, program instructions, e.g., PIM commands, involving a memory device having PIM capabilities can distribute implementation of the PIM commands and data over multiple sensing circuitries that can implement operations and can move and store the PIM commands and data within the memory array, e.g., without having to transfer such back and forth over an A/C and data bus between a host and the memory device. Thus, data for a memory device having PIM capabilities can be accessed and used in less time and using less power. For example, a time and power advantage can be realized by increasing the speed, rate, and efficiency of data being moved around and stored in a computing system in order to process requested memory array operations (e.g., reads, writes, etc.).

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" include singular and plural referents, unless the context clearly dictates otherwise, as do "a number of", "at least one", and "one or more" (e.g., a number of memory arrays can refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically or for access to and movement (transmission) of instructions (e.g., control signals) and data, as appropriate to the context.

The figures herein follow a numbering convention in which the first digit or digits correspond to the figure number and the remaining digits identify an element or component in the figure. Similar elements or components between different figures may be identified by the use of similar digits. For example, 108 may reference element "08" in FIG. 1, and a similar element may be referenced as 208 in FIG. 2. As will be appreciated, elements shown in the various embodiments herein can be added, exchanged, and eliminated so as to provide a number of additional embodiments of the present disclosure. In addition, the proportion and the relative scale of the elements provided in the figures are intended to illustrate certain embodiments of the present disclosure and should not be taken in a limiting sense.

FIG. 1A is a block diagram of an apparatus in the form of a computing system 100 including a memory device 120 in accordance with a number of embodiments of the present disclosure. As used herein, a memory device 120, controller 140, channel controller 143, memory array 130, sensing circuitry 150, including sensing amplifiers (e.g., sense amplifier 206 as shown in and described in connection with FIG. 2 and at corresponding reference numbers in FIGS. 3 and 4A-4B) and compute circuitry (e.g., compute component 231 as shown in and described in connection with FIG. 2 and at corresponding reference numbers in FIGS. 3 and 4A-4B), and peripheral sense amplifier and logic 170 might each also be separately considered an "apparatus."

The system 100 can include a host 110 coupled (e.g., connected) to memory device 120, which includes the memory array 130. Host 110 can be a host system such as a personal laptop computer, a desktop computer, a tablet computer, a digital camera, a smart phone, or a memory card reader, among various other types of hosts. Host 110 can include a system motherboard and backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and a high performance computing (HPC) system and a portion thereof. Although the example shown in FIG. 1A illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, description of the system 100 has been simplified to focus on features with particular relevance to the present disclosure. For example, in various embodiments, the memory array 130 can be a DRAM array, SRAM array, STT RAM array, PCRAM array, TRAM array, RRAM array, NAND flash array, and NOR flash array, for instance. The memory array 130 can include memory cells arranged in rows coupled by access lines (which may be referred to herein as word lines or select lines) and columns coupled by sense lines (which may be referred to herein as data lines or digit lines). Although a single memory array 130 is shown in FIG. 1A, embodiments are not so limited. For instance, memory device 120 may include a number of memory arrays 130 (e.g., a number of banks of DRAM cells, NAND flash cells, etc.) in addition to a number subarrays, as described herein. Accordingly, descriptions in the present disclosure may be made with regard to PIM and/or DRAM architectures by way of example and/or clarity. However, unless explicitly stated otherwise, the scope of the present disclosure and claims is not limited to PIM and/or DRAM architectures.

The memory device 120 can include address circuitry 142 to latch address signals provided over a data bus 156 (e.g., an I/O bus from the host 110) by I/O circuitry 144 (e.g., provided to external ALU circuitry and to DRAM DQs via local I/O lines and global I/O lines). Status and exception information can be provided from the controller 140 on the memory device 120 to a channel controller 143, for example, through a high speed interface (HSI) out-of-band bus 157, which in turn can be provided from the channel controller 143 to the host 110. Address signals are received through address circuitry 142 and decoded by a row decoder 146 and a column decoder 152 to access the memory array 130. Data can be sensed (read) from memory array 130 by sensing voltage and current changes on sense lines (digit lines) using a number of sense amplifiers, as described herein, of the sensing circuitry 150. A sense amplifier can read and latch a page (e.g., a row) of data from the memory array 130. Additional compute circuitry, as described herein, can be coupled to the sensing circuitry 150 and can be used in combination with the sense amplifiers to sense, store, e.g., cache and buffer, and move data. The I/O circuitry 144 can be used for bi-directional data communication with host 110 over the data bus 156 (e.g., a 64 bit wide data bus). The write circuitry 148 can be used to write data to the memory array 130.

Controller 140, e.g., bank control logic and sequencer, can decode signals (e.g., commands) provided by control bus 154 from the host 110. The controller 140 can control operations by issuing control signals determined from the decoded commands from the host 110. These signals can include chip enable signals, write enable signals, and address latch signals that can be used to control operations performed on the memory array 130, including data sense, data store, data move, data write, and data erase operations, among other operations. In various embodiments, the controller 140 can be responsible for executing instructions from the host 110 and accessing the memory array 130. The control signals may be executed by processing resources external to and/or internal to a memory array 130 (e.g., by compute components 231 in sensing circuitry 150, as described herein). The controller 140 can be a state machine, a sequencer, or some other type of controller. The controller 140 can control shifting data (e.g., right or left) in a row of an array, e.g., memory array 130.

Examples of the sensing circuitry 150 are described further below, e.g., in FIGS. 2 and 3. For instance, in a number of embodiments, the sensing circuitry 150 can include a number of sense amplifiers and a number of compute components, which may serve as an accumulator and can be used to perform operations (e.g., on data associated with complementary sense lines).

In a number of embodiments, the sensing circuitry 150 can be used to perform operations using data stored in memory array 130 as inputs and participate in movement of the data for writing and storage operations back to a different location in the memory array 130 without transferring the data via a sense line address access (e.g., without firing a column decode signal). As such, various compute functions can be performed using, and within, sensing circuitry 150 rather than (or in association with) being performed by processing resources external to the sensing circuitry 150 (e.g., by a processor associated with host 110 and other processing circuitry, such as ALU circuitry, located on device 120, such as on controller 140 or elsewhere).

In various previous approaches, data associated with an operand, for instance, would be read from memory via sensing circuitry and provided to external ALU circuitry, e.g., in the host, via I/O lines (e.g., via local I/O lines and global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform operations on data stored in memory array 130 and store the result back to the memory array 130 without enabling a local I/O line and global I/O line coupled to the sensing circuitry 150, e.g., for read and/or write operations based on host commands. In contrast, the data movement operations described herein utilize a cooperative interaction between the sensing circuitry 150 and shared I/O lines 155 described herein. The sensing circuitry 150 and the shared I/O lines 155 may be formed on chip with the memory cells of the array (e.g., formed on the same chip as the memory cells in the array). Additional peripheral sense amplifier and logic 170 can be coupled to the sensing circuitry 150. The sensing circuitry 150 and the peripheral sense amplifier and logic 170 can cooperate in performing operations, according to some embodiments described herein.

As such, in a number of embodiments, circuitry external to memory array 130 and sensing circuitry 150 is not needed to perform compute functions as the sensing circuitry 150 can perform the appropriate operations in order to perform such compute functions without the use of an external processing resource. Therefore, the sensing circuitry 150 may be used to complement and to replace, at least to some extent, such an external processing resource (or at least the bandwidth consumption of such an external processing resource).

In a number of embodiments, the sensing circuitry 150 may be used to perform operations (e.g., to execute instructions) in addition to operations performed by an external processing resource (e.g., host 110). For instance, either of the host 110 and the sensing circuitry 150 may be limited to performing only certain operations and a certain number of operations.

Enabling a local I/O line and global I/O line, e.g., for read and/or write operations, can include enabling (e.g., turning on) a transistor having a gate coupled to a decode signal (e.g., a column decode 152 signal) and a source/drain coupled to the local I/O line and/or global I/O line. However, embodiments are not limited to not enabling a local I/O line and global I/O line. For instance, in a number of embodiments, the sensing circuitry 150 can be used to perform operations, such as data movement, without enabling column decode lines 152 of the array. However, the local I/O line(s) and global I/O line(s) may be enabled in order to transfer a result to a suitable location other than back to the memory array 130 (e.g., to an external register).

Figure 1B:
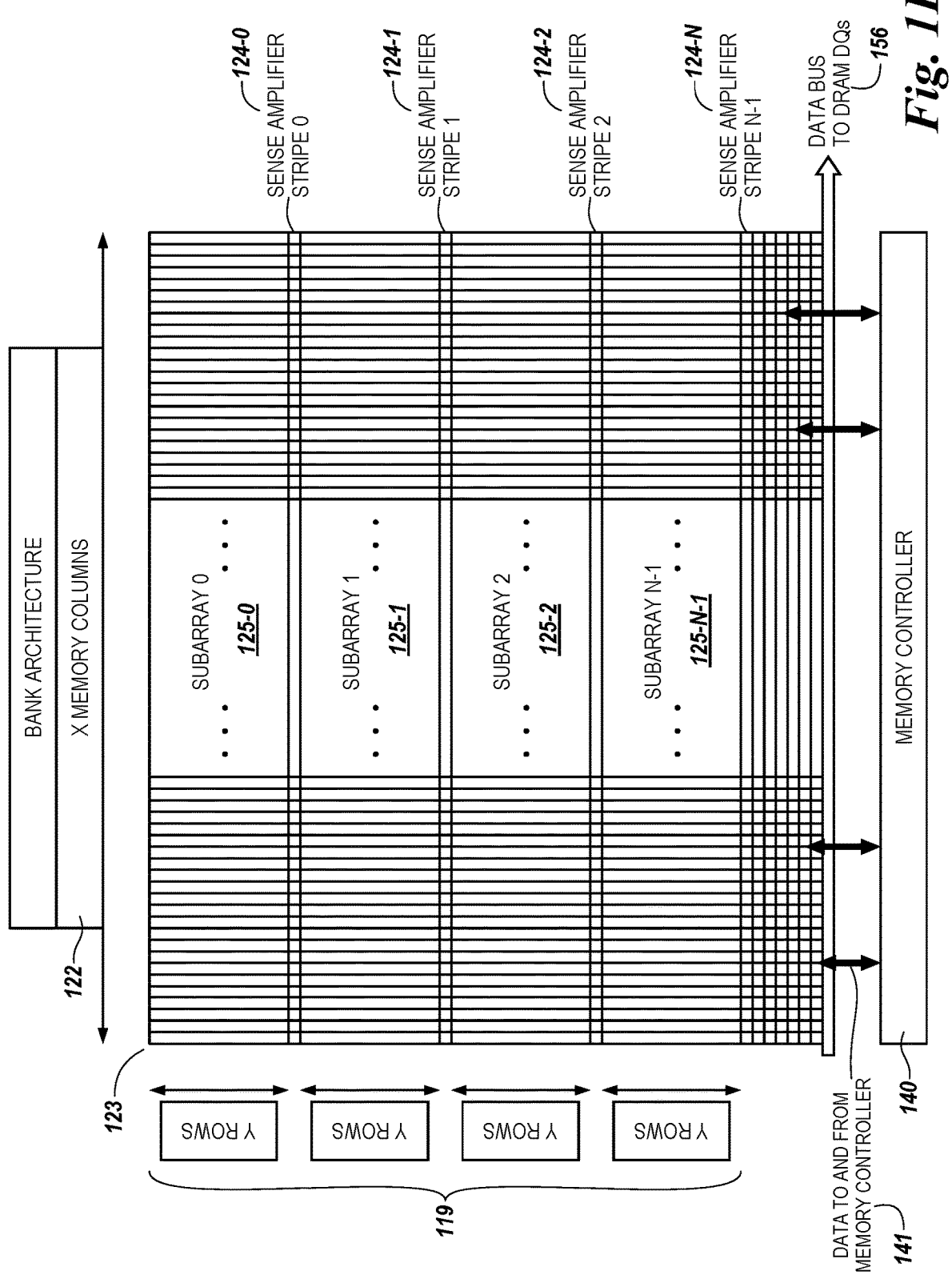
FIG. 1B is a block diagram of a bank section to a memory device in accordance with a number of embodiments of the present disclosure.

FIG. 1B is a block diagram of a bank section 123 to a memory device in accordance with a number of embodiments of the present disclosure. For example, bank section 123 can represent an example section of a number of bank sections to a bank of a memory device (e.g., bank section 0, bank section 1, . . . , bank section M). As shown in FIG. 1B, a bank architecture can include a plurality of memory columns 122 shown horizontally as X (e.g., 16,384 columns in an example DRAM bank and bank section). Additionally, the bank section 123 may be divided into subarray 0, subarray 1, . . . , and subarray N-1 (e.g., 128 subarrays) shown at 125-0, 125-1, . . . , 125-N-1, respectively, that are separated by amplification regions configured to be coupled to a data path, e.g., the shared I/O line described herein. As such, the subarrays 125-0, 125-1, . . . , 125-N-1 can each have amplification regions shown 124-0, 124-1, . . . , 124-N-1 that correspond to sensing component stripe 0, sensing component stripe 1, . . . , and sensing component stripe N-1, respectively.

Each column 122 is configured to be coupled to sensing circuitry 150, as described in connection with FIG. 1A and elsewhere herein. As such, each column in a subarray can be coupled individually to a sense amplifier and compute component that contribute to a sensing component stripe for that subarray. For example, as shown in FIG. 1B, the bank architecture can include sensing component stripe 0, sensing component stripe 1, . . . , sensing component stripe N-1 that each have sensing circuitry 150 with sense amplifiers and compute components that can, in various embodiments, be used as registers, cache and data buffering and that are coupled to each column 122 in the subarrays 125-0, 125-1, . . . , 125-N-1. The compute component within the sensing circuitry 150 coupled to the memory array 130, as shown in FIG. 1A, can complement the cache 171 associated with the controller 140.

Each of the of the subarrays 125-0, 125-1, . . . , 125-N-1 can include a plurality of rows 119 shown vertically as Y (e.g., each subarray may include 512 rows in an example DRAM bank). Example embodiments are not limited to the example horizontal and vertical orientation of columns and rows described herein or the example numbers thereof.

As shown in FIG. 1B, the bank architecture can be associated with controller 140. The controller 140 shown in FIG. 1B can, in various examples, represent at least a portion of the functionality embodied by and contained in the controller 140 shown in FIG. 1A. The controller 140 can direct (e.g., control) input of control signals based on commands and data 141 to the bank architecture and output of data from the bank architecture, e.g., to the host 110, along with control of data movement in the bank architecture, as described herein. The bank architecture can include a data bus 156 (e.g., a 64 bit wide data bus) to DRAM DQs, which can correspond to the data bus 156 described in connection with FIG. 1A.

Figure 1C:
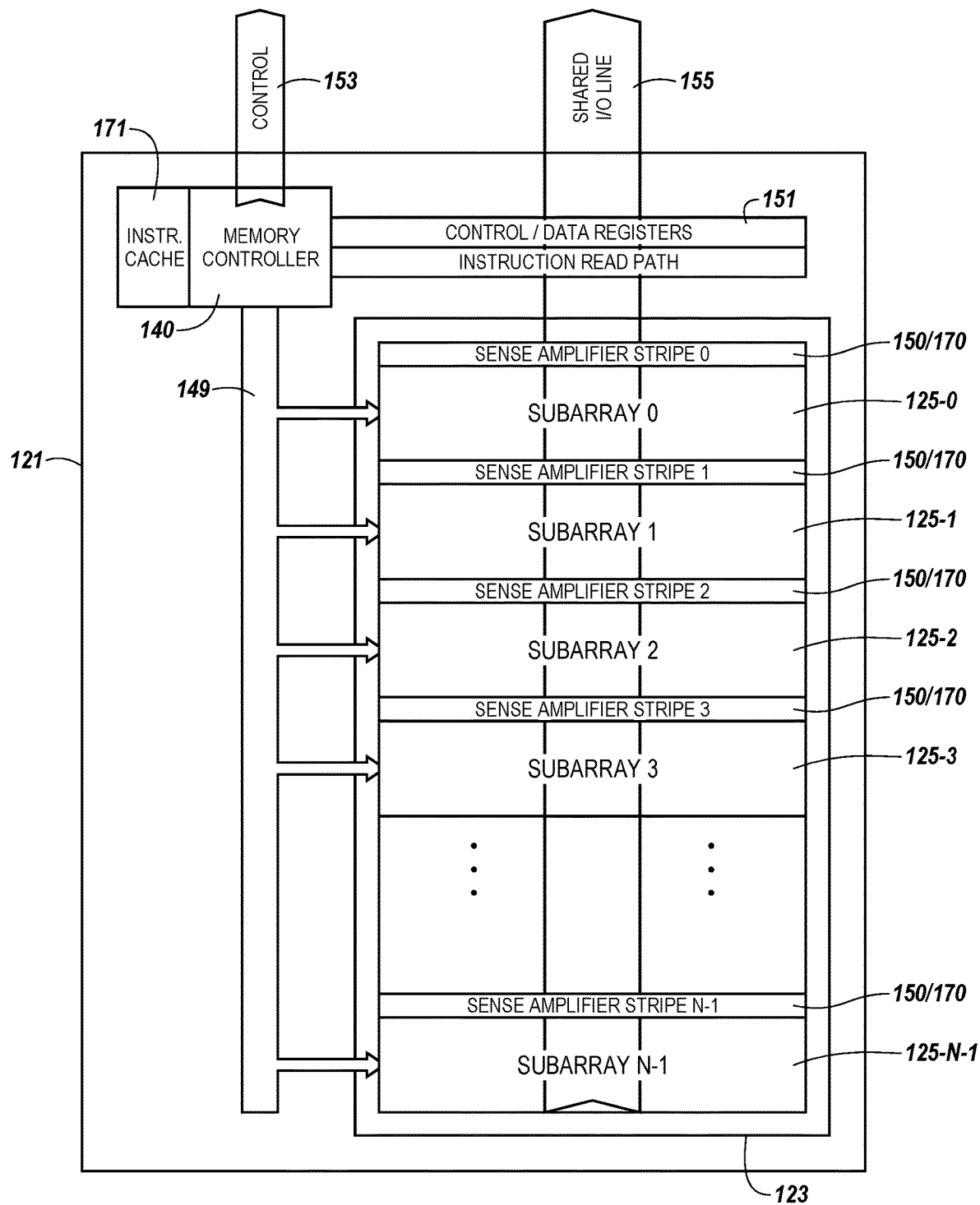
FIG. 1C is a block diagram of a bank to a memory device in accordance with a number of embodiments of the present disclosure.

FIG. 1C is a block diagram of a bank 121 to a memory device in accordance with a number of embodiments of the present disclosure. For example, bank 121 can represent an example bank to a memory device (e.g., bank 0, bank 1, . . . , bank M). As shown in FIG. 1C, a bank architecture can include an address/control (A/C) path 153, e.g., a bus, coupled a controller 140. Again, the controller 140 shown in FIG. 1C can, in various examples, represent at least a portion of the functionality embodied by and contained in the controller 140 shown in FIGS. 1A and 1B.

As shown in FIG. 1C, a bank architecture can include a plurality of bank sections, e.g., bank section 123, in a particular bank 121. As further shown in FIG. 1C, a bank section 123 can be subdivided into a plurality of subarrays (e.g., subarray 0, subarray 1, . . . , subarray N-1 shown at 125-1, 125-2, . . . , 125-N-1) respectively separated by sensing component stripes 124-0, 124-1, . . . , 124-N-1, as shown in FIG. 1B, that include sensing circuitry and logic circuitry 150/170, as shown in FIG. 1A and described further in connection with FIGS. 2-5.

As described herein, an I/O line can be selectably shared by a plurality of partitions, subarrays, rows, and particular columns of memory cells via the sensing component stripe coupled to each of the subarrays. For example, the sense amplifier and/or compute component of each of a selectable subset of a number of columns (e.g., eight column subsets of a total number of columns) can be selectably coupled to each of the plurality of shared I/O lines for data values stored (cached) in the sensing component stripe to be moved (e.g., transferred, transported, and/or fed) to each of the plurality of shared I/O lines. Because the singular forms "a", "an", and "the" can include both singular and plural referents herein, "a shared I/O line" can be used to refer to "a plurality of shared I/O lines", unless the context clearly dictates otherwise. Moreover, "shared I/O lines" is an abbreviation of "plurality of shared I/O lines".

As shown schematically in FIG. 1C, an architecture of a bank 121 and each section 123 of the bank can include a plurality of shared I/O lines 155 (e.g., data path, bus) configured to couple to the plurality of subarrays 125-0, 125-1, . . . , 125-N-1 of memory cells of the bank section 123 and a plurality of banks (not shown). The shared I/O lines 155 can be selectably coupled between subarrays, rows, and particular columns of memory cells via the sensing component stripes represented by 124-0, 124-1, . . . , 124-N-1 shown in FIG. 1B. As noted, the sensing component stripes 124-0, 124-1, . . . , 124-N-1 each include sensing circuitry 150 with sense amplifiers and compute components configured to couple to each column of memory cells in each subarray, as shown in FIG. 1A and described further in connection with FIGS. 2-5.

The shared I/O lines 155 can be utilized to increase a speed, rate, and efficiency of data movement in a PIM array, e.g., between subarrays. In at least one embodiment, using the shared I/O lines 155 provides an improved data path by providing at least a thousand bit width. In one embodiment, 2048 shared I/O lines are coupled to 16,384 columns to provide a 2048 bit width. The illustrated shared I/O lines 155 can be formed on chip with the memory cells of the array.

In some embodiments, the controller 140 may be configured to provide instructions (control signals based on commands) and data to a plurality of locations of a particular bank 121 in the memory array 130 and to the sensing component stripes 124-0, 124-1, . . . , 124-N-1 via the shared I/O lines 155 with control and data registers 151. For example, the control and data registers 151 can provide instructions to be executed using by the sense amplifiers and the compute components of the sensing circuity 150 in the sensing component stripes 124-0, 124-1, . . . , 124-N-1. FIG. 1C illustrates an instruction cache 171 associated with the controller 140 and coupled to a write path 149 to each of the subarrays 125-0, . . . , 125-N-1 in the bank 121.

Implementations of PIM DRAM architecture may perform processing at the sense amplifier and compute component level. Implementations of PIM DRAM architecture may allow only a finite number of memory cells to be connected to each sense amplifier (e.g., around 512 memory cells). A sensing component stripe 124 may include from around 8,000 to around 16,000 sense amplifiers. For example, a sensing component stripe 124 may be configured to couple to an array of 512 rows and around 16,000 columns. A sensing component stripe can be used as a building block to construct the larger memory. In an array for a memory device, there may be 128 sensing component stripes, which corresponds to 128 subarrays, as described herein. Hence, 512 rows times 128 sensing component stripes would yield around 66,000 rows intersected by around 16,000 columns to form around a 1 gigabit DRAM.

As such, when processing at the sense amplifier level, there are only 512 rows of memory cells available to perform logic functions with each other and it may not be possible to easily perform logic functions on multiple rows where data is coupled to different sensing component stripes. To accomplish processing of data in different subarrays coupled to different sensing component stripes, all the data to be processed is moved into the same subarray in order to be coupled to the same sensing component stripe.

However, DRAM implementations have not been utilized to move data from one sensing component stripe to another sensing component stripe. As mentioned, a sensing component stripe can contain as many as 16,000 sense amplifiers, which corresponds to around 16,000 columns or around 16,000 data values, e.g., bits, of data to be stored, e.g., cached, from each row. A DRAM DQ data bus, e.g., as shown at 156 in FIGS. 1A-1B, may be configured as a 64 bit part. As such, to transfer (move) the entire data from a 16,000 bit row from one sensing component stripe to another sensing component stripe using a DRAM DQ data bus would take, for instance, 256 cycles, e.g., 16,000 divided by 64.

In order to achieve data movement conducted with a high speed, rate, and efficiency from one sensing component stripe to another in PIM DRAM implementations, shared I/O lines 155 are described herein. For example, with 2048 shared I/O lines configured as a 2048 bit wide shared I/O line 155, movement of data from a full row, as just described, would take 8 cycles, a 32 times increase in the speed, rate, and efficiency of data movement. As such, compared other PIM DRAM implementations (e.g., relative to a 64 bit wide data path), utilization of the structures and processes described in the present disclosure saves time for data movement. In various embodiments, time may be saved, for example, by not having to read data out of one bank, bank section, and subarray thereof, storing the data, and then writing the data in another location and/or by reducing the number of cycles for data movement.

Figure 2:
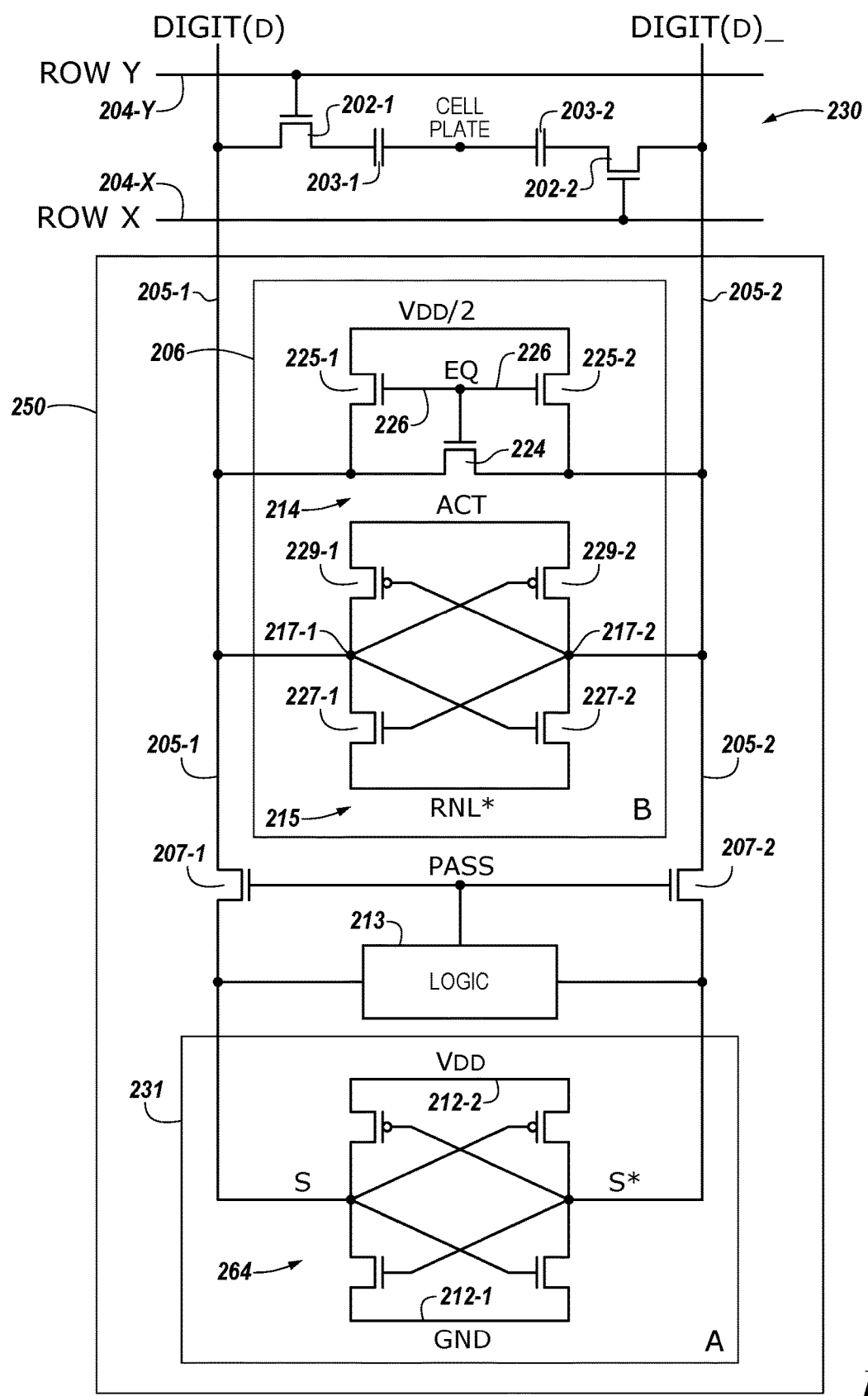
FIG. 2 is a schematic diagram illustrating sensing circuitry to a memory device in accordance with a number of embodiments of the present disclosure.

FIG. 2 is a schematic diagram illustrating sensing circuitry 250 in accordance with a number of embodiments of the present disclosure. The sensing circuitry 250 can correspond to sensing circuitry 150 shown in FIG. 1A.

A memory cell can include a storage element (e.g., capacitor) and an access device (e.g., transistor). For instance, a first memory cell can include transistor 202-1 and capacitor 203-1, and a second memory cell can include transistor 202-2 and capacitor 203-2, etc. In this embodiment, the memory array 230 is a DRAM array of 1T1C (one transistor one capacitor) memory cells, although other embodiments of configurations can be used (e.g., 2T2C with two transistors and two capacitors per memory cell). In a number of embodiments, the memory cells may be destructive read memory cells (e.g., reading the data stored in the cell destroys the data such that the data originally stored in the cell is refreshed after being read).

Figure 3:
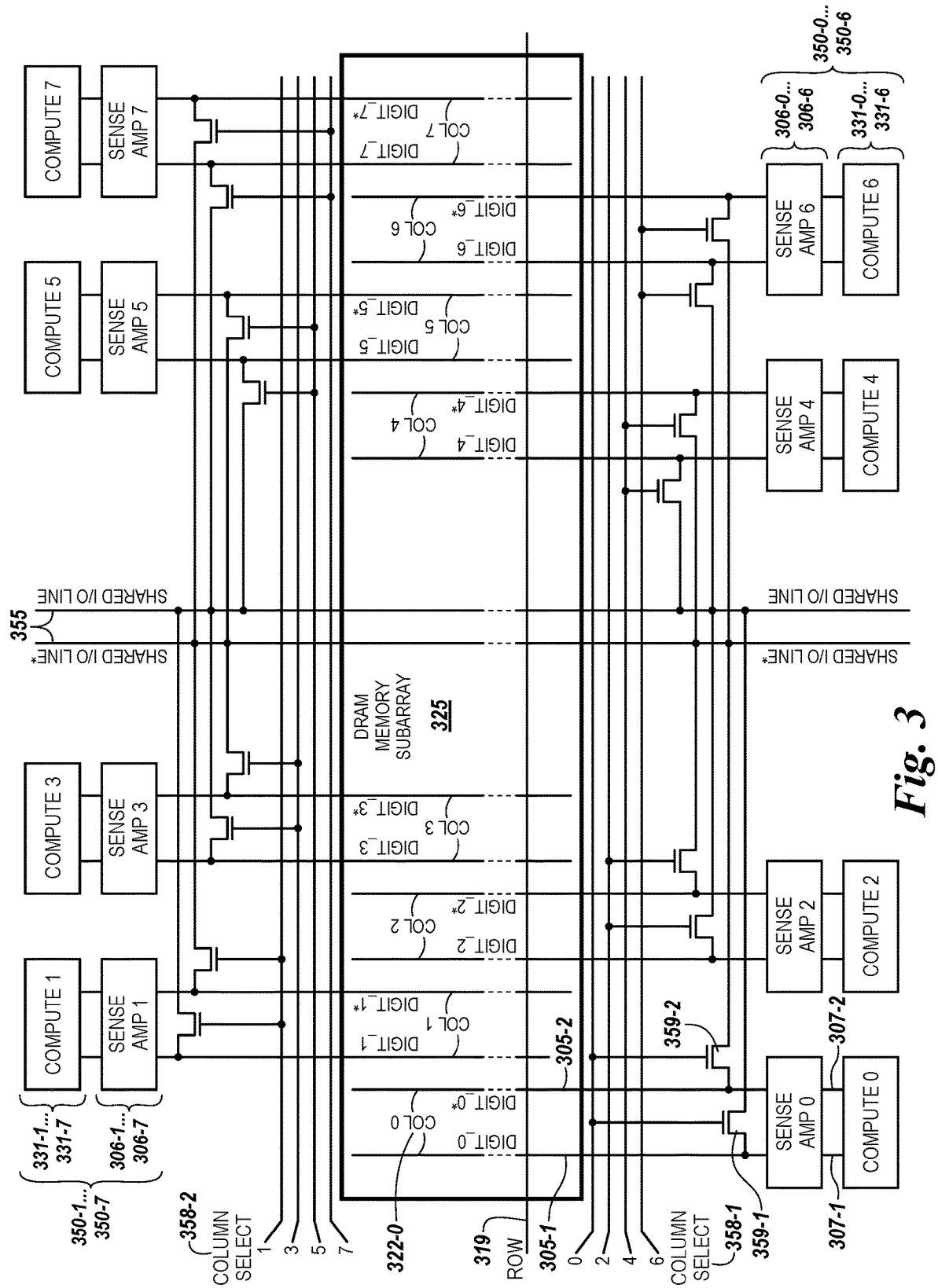
FIG. 3 is a schematic diagram illustrating circuitry for data movement to a memory device in accordance with a number of embodiments of the present disclosure.
Figure 4A:
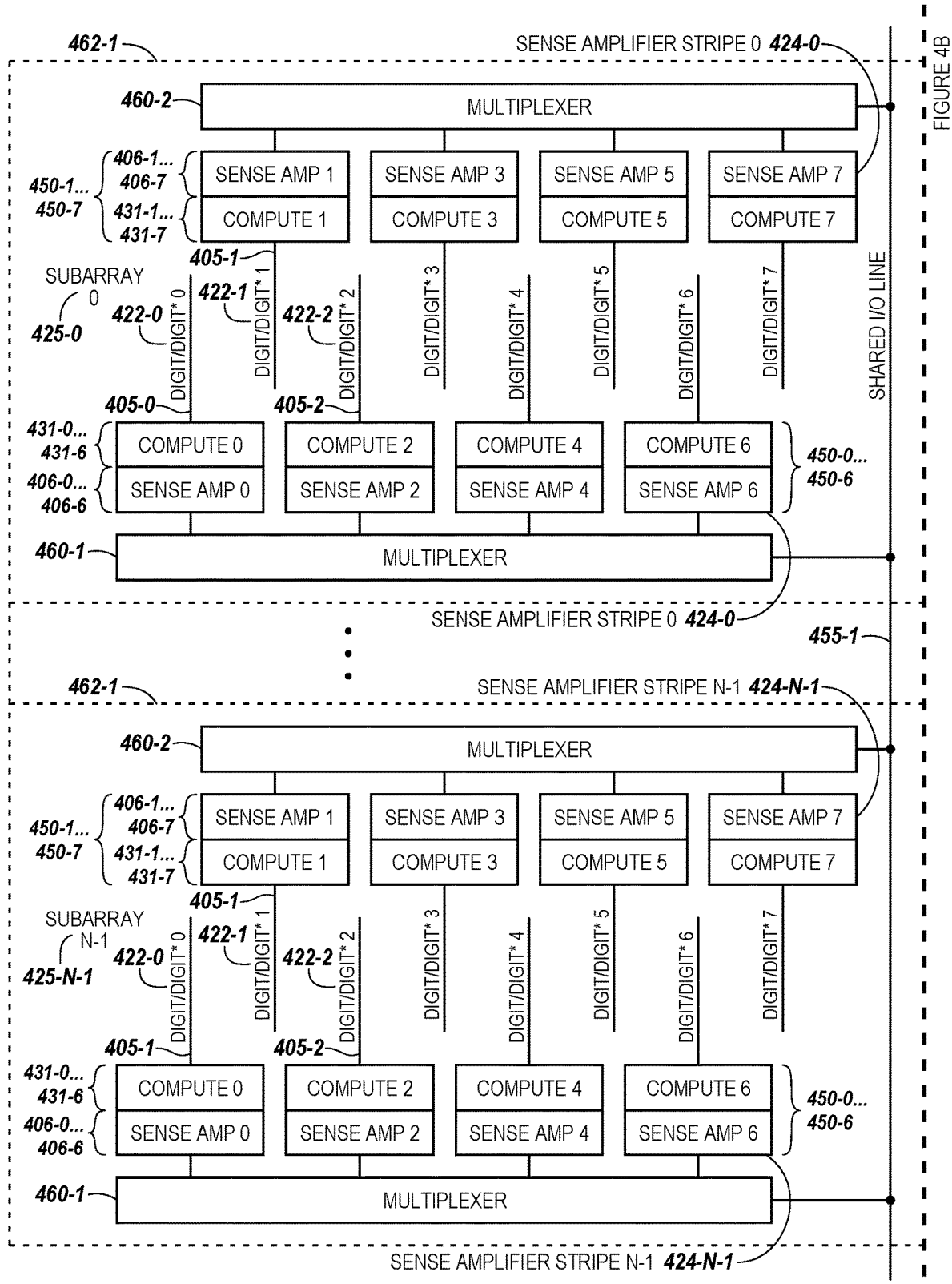
FIGS. 4A-4B is another schematic diagram illustrating circuitry for data movement to a memory device in accordance with a number of embodiments of the present disclosure.
Figure 4B:
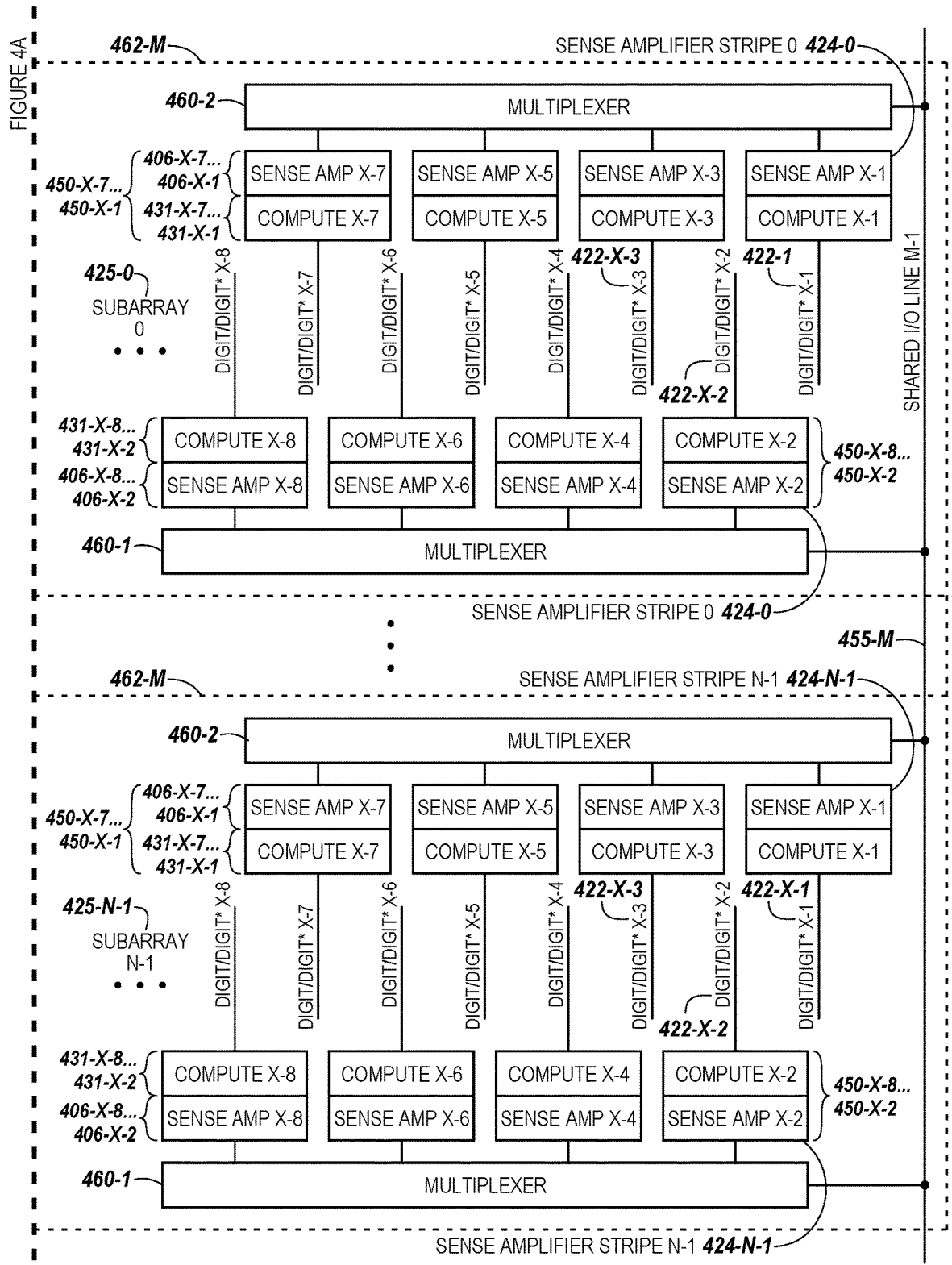

The cells of the memory array 230 can be arranged in rows coupled by access (word) lines 204-X (Row X), 204-Y (Row Y), etc., and columns coupled by pairs of complementary sense lines (e.g., digit lines DIGIT(D) and DIGIT (D)_ shown in FIG. 2 and DIGIT_0 and DIGIT_0* shown in FIGS. 3 and 4A-4B). The individual sense lines corresponding to each pair of complementary sense lines can also be referred to as digit lines 205-1 for DIGIT (D) and 205-2 for DIGIT (D)_, respectively, or corresponding reference numbers in FIGS. 3 and 4A-4B. Although only one pair of complementary digit lines are shown in FIG. 2, embodiments of the present disclosure are not so limited, and an array of memory cells can include additional columns of memory cells and digit lines (e.g., 4,096, 8,192, 16,384, etc.).

Memory cells can be coupled to different digit lines and word lines. For example, a first source/drain region of a transistor 202-1 can be coupled to digit line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to digit line 205-2 (D)_, a second source/drain region of transistor 202-2 can be coupled to capacitor 203-2, and a gate of a transistor 202-2 can be coupled to word line 204-X. A cell plate, as shown in FIG. 2, can be coupled to each of capacitors 203-1 and 203-2. The cell plate can be a common node to which a reference voltage (e.g., ground) can be applied in various memory array configurations.

The memory array 230 is configured to couple to sensing circuitry 250 in accordance with a number of embodiments of the present disclosure. In this embodiment, the sensing circuitry 250 comprises a sense amplifier 206 and a compute component 231 corresponding to respective columns of memory cells (e.g., coupled to respective pairs of complementary digit lines). The sense amplifier 206 can be coupled to the pair of complementary digit lines 205-1 and 205-2. The compute component 231 can be coupled to the sense amplifier 206 via pass gates 207-1 and 207-2. The gates of the pass gates 207-1 and 207-2 can be coupled to operation selection logic 213.

The operation selection logic 213 can be configured to include pass gate logic for controlling pass gates that couple the pair of complementary digit lines un-transposed between the sense amplifier 206 and the compute component 231 and swap gate logic for controlling swap gates that couple the pair of complementary digit lines transposed between the sense amplifier 206 and the compute component 231. The operation selection logic 213 can also be coupled to the pair of complementary digit lines 205-1 and 205-2. The operation selection logic 213 can be configured to control continuity of pass gates 207-1 and 207-2 based on a selected operation.

The sense amplifier 206 can be operated to determine a data value (e.g., logic state) stored in a selected memory cell. The sense amplifier 206 can comprise a cross coupled latch, which can be referred to herein as a primary latch. In the example illustrated in FIG. 2, the circuitry corresponding to sense amplifier 206 comprises a latch 215 including four transistors coupled to a pair of complementary digit lines D 205-1 and (D)_205-2. However, embodiments are not limited to this example. The latch 215 can be a cross coupled latch, e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). The cross coupled latch 215 comprising transistors 227-1, 227-2, 229-1, and 229-2 can be referred to as a primary latch.

In operation, when a memory cell is being sensed (e.g., read), the voltage on one of the digit lines 205-1 (D) or 205-2 (D)_ will be slightly greater than the voltage on the other one of digit lines 205-1 (D) or 205-2 (D)_. An ACT signal and an RNL* signal can be driven low to enable (e.g., fire) the sense amplifier 206. The digit lines 205-1 (D) or 205-2 (D)_ having the lower voltage will turn on one of the PMOS transistor 229-1 or 229-2 to a greater extent than the other of PMOS transistor 229-1 or 229-2, thereby driving high the digit line 205-1 (D) or 205-2 (D)_ having the higher voltage to a greater extent than the other digit line 205-1 (D) or 205-2 (D)_ is driven high.

Similarly, the digit line 205-1 (D) or 205-2 (D)_ having the higher voltage will turn on one of the NMOS transistor 227-1 or 227-2 to a greater extent than the other of the NMOS transistor 227-1 or 227-2, thereby driving low the digit line 205-1 (D) or 205-2 (D)_ having the lower voltage to a greater extent than the other digit line 205-1 (D) or 205-2 (D)_ is driven low. As a result, after a short delay, the digit line 205-1 (D) or 205-2 (D)_ having the slightly greater voltage is driven to the voltage of the supply voltage $V_{CC}$ through a source transistor, and the other digit line 205-1 (D) or 205-2 (D)_ is driven to the voltage of the reference voltage (e.g., ground) through a sink transistor. Therefore, the cross coupled NMOS transistors 227-1 and 227-2 and PMOS transistors 229-1 and 229-2 serve as a sense amplifier pair, which amplify the differential voltage on the digit lines 205-1 (D) and 205-2 (D)_ and operate to latch a data value sensed from the selected memory cell. As used herein, the cross coupled latch of sense amplifier 206 may be referred to as a primary latch 215.

Embodiments are not limited to the sense amplifier 206 configuration illustrated in FIG. 2. As an example, the sense amplifier 206 can be a current-mode sense amplifier and a single-ended sense amplifier (e.g., sense amplifier coupled to one digit line). Also, embodiments of the present disclosure are not limited to a folded digit line architecture such as that shown in FIG. 2.

The sense amplifier 206 can, in conjunction with the compute component 231, be operated to perform various operations using data from an array as input. In a number of embodiments, the result of an operation can be stored back to the array without transferring the data via a digit line address access (e.g., without firing a column decode signal such that data is transferred to circuitry external from the array and sensing circuitry via local I/O lines). As such, a number of embodiments of the present disclosure can enable performing operations and compute functions associated therewith using less power than various previous approaches. Additionally, since a number of embodiments eliminate the need to transfer data across local and global I/O lines in order to perform compute functions (e.g., between memory and discrete processor), a number of embodiments can enable an increased (e.g., faster) processing capability as compared to previous approaches.

The sense amplifier 206 can further include equilibration circuitry 214, which can be configured to equilibrate the digit lines 205-1 (D) and 205-2 (D)_. In this example, the equilibration circuitry 214 comprises a transistor 224 coupled between digit lines 205-1 (D) and 205-2 (D)_. The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 can be coupled digit line 205-1 (D), and a second source/drain region of transistor 225-2 can be coupled digit line 205-2 (D)_. Gates of transistors 224, 225-1, and 225-2 can be coupled together, and to an equilibration (EQ) control signal line 226. As such, activating EQ enables the transistors 224, 225-1, and 225-2, which effectively shorts digit lines 205-1 (D) and 205-2 (D)_ together and to the equilibration voltage (e.g., $V_{CC}/2$).

Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As described further below, in a number of embodiments, the sensing circuitry 250 (e.g., sense amplifier 206 and compute component 231) can be operated to perform a selected operation and initially store the result in one of the sense amplifier 206 or the compute component 231 without transferring data from the sensing circuitry via a local or global I/O line (e.g., without performing a sense line address access via activation of a column decode signal, for instance).

Performance of logical operations (e.g., Boolean logical functions involving data values) is fundamental and commonly used. Boolean logic functions are used in many higher level functions. Consequently, speed and power efficiencies that can be realized with improved logical operations, can translate into speed and power efficiencies of higher order functionalities.

As shown in FIG. 2, the compute component 231 can also comprise a latch, which can be referred to herein as a secondary latch 264. The secondary latch 264 can be configured and operated in a manner similar to that described above with respect to the primary latch 215, with the exception that the pair of cross coupled p-channel transistors (e.g., PMOS transistors) included in the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component 231 is not limited to that shown in FIG. 2, and various other embodiments are feasible.

FIG. 3 is a schematic diagram illustrating circuitry for data movement to a memory device in accordance with a number of embodiments of the present disclosure. FIG. 3 shows, for example, eight sense amplifiers, e.g., sense amplifiers 0, 1, . . . , 7 shown at 306-0, 306-1, . . . , 306-7, respectively, each coupled to a pair of complementary sense lines, e.g., digit lines 305-1 and 305-2. FIG. 3 also shows, for example, eight compute components, e.g., compute components 0, 1, . . . , 7 shown at 331-0, 331-1, . . . , 331-7, each coupled to a sense amplifier, e.g., as shown for sense amplifier 0 306-0, via pass gates and digit lines 307-1 and 307-2. For example, the pass gates can be connected as shown in FIG. 2 and can be controlled by an operation selection signal, Pass. For example, an output of the selection logic can be coupled to the gates of the pass gates and digit lines 307-1 and 307-2. Corresponding pairs of the sense amplifiers and compute components can contribute to formation of the sensing circuitry indicated at 350-0, 350-1, . . . , 350-7.

Data values present on the pair of complementary digit lines 305-1 and 305-2 can be loaded into the compute component 331-0 as described in connection with FIG. 2. For example, when the pass gates are open, data values on the pair of complementary digit lines 305-1 and 305-2 can be passed from the sense amplifiers to the compute component, e.g., 306-0 to 331-0. The data values on the pair of complementary digit lines 305-1 and 305-2 can be the data value stored in the sense amplifier 306-0 when the sense amplifier is fired.

The sense amplifiers 306-0, 306-1, . . . , 306-7 in FIG. 3 can each correspond to sense amplifier 206 shown in FIG. 2. The compute components 331-0, 331-1, . . . , 331-7 shown in FIG. 3 can each correspond to compute component 231 shown in FIG. 2. A combination of one sense amplifier with one compute component can contribute to the sensing circuitry, e.g., 350-0, 350-1, . . . , 350-7, of a portion of a DRAM memory subarray 325 configured to couple to a shared I/O line 355, as described herein. The paired combinations of the sense amplifiers 306-0, 306-1, . . . , 306-7 and the compute components 331-0, 331-1, . . . , 331-7, shown in FIG. 3, can be included in a sensing component stripe, as shown at 124 in FIG. 1B and at 424 in FIGS. 4A and 4B.

The configurations of embodiments illustrated in FIG. 3 are shown for purposes of clarity and are not limited to these configurations. For instance, the configuration illustrated in FIG. 3 for the sense amplifiers 306-0, 306-1, . . . , 306-7 in combination with the compute components 331-0, 331-1, . . . , 331-7 and the shared I/O line 355 is not limited to half the combination of the sense amplifiers 306-0, 306-1, . . . , 306-7 with the compute components 331-0, 331-1, . . . , 331-7 of the sensing circuitry being formed above the columns 322 of memory cells (not shown) and half being formed below the columns 322 of memory cells. Nor are the number of such combinations of the sense amplifiers with the compute components forming the sensing circuitry configured to couple to a shared I/O line limited to eight. In addition, the configuration of the shared I/O line 355 is not limited to being split into two for separately coupling each of the two sets of complementary digit lines 305-1 and 305-2, nor is the positioning of the shared I/O line 355 limited to being in the middle of the combination of the sense amplifiers and the compute components forming the sensing circuitry, e.g., rather than being at either end of the combination of the sense amplifiers and the compute components.

The circuitry illustrated in FIG. 3 also shows column select circuitry 358-1, 358-2 that is configured to implement data movement operations on particular columns 322 of a subarray 325 and the complementary digit lines 305-1 and 305-2 thereof (e.g., as directed by the controller 140 shown in FIGS. 1A-1C), coupling sensed data values to the shared I/O line 355. For example, column select circuitry 358-1 has select lines 0, 2, 4, and 6 that are configured to couple to corresponding columns, such as column 0 (332-0), column 2, column 4, and column 6. Column select circuitry 358-2 has select lines 1, 3, 5, and 7 that are configured to couple to corresponding columns, such as column 1, column 3, column 5, and column 7.

Controller 140 can be coupled to column select circuitry 358 to control select lines, e.g., select line 1, to access data values stored in the sense amplifiers, compute components and/or present on the pair of complementary digit lines, e.g., 305-1 and 305-2 when selection transistors 359-1, 359-2 are enabled via signals from column select line 0. Opening the selection transistors 359-1, 359-2 (e.g., as directed by the controller 140) enables coupling of sense amplifier 0 306-0 and compute component 0 331-0 to couple with complementary digit lines 305-1 and 305-2 of column 0 (322-0) to move data values on digit line 0 and digit line 0* for a particular row 319 stored in sense amplifier 306-0 and/or compute component 331-0. Data values from rows in each of columns 0 through 7 can similarly be selected by controller 140 coupling, via an appropriate select line, a particular combination of a sense amplifier and a compute component with a pair of complementary digit lines by opening the appropriate selection transistors.

Moreover, opening the selection transistors, e.g., selection transistors 359-1, 359-2, enables a particular sense amplifier and/or compute component, e.g., 306-0 and/or 331-0, to be coupled with a shared I/O line 355 such that the sensed (stored) data values can be placed on, e.g., transferred to, the shared I/O line 355. In some embodiments, one column at a time is selected, e.g., column 0 322-0, to be coupled to a particular shared I/O line 355 to move, e.g., transfer, the sensed data values. In the example configuration of FIG. 3, the shared I/O line 355 is illustrated as a shared, differential I/O line pair, e.g., shared I/O line and shared I/O line*. Hence, selection of column 0 322-0 could yield two data values (e.g., two bits with values of 0 and/or 1) from a row, e.g., 319, stored in the sense amplifier and/or compute component associated with complementary digit lines 305-1 and 305-2. These data values could be input in parallel to each of the shared, differential I/O pair, shared I/O and shared I/O*, of the shared differential I/O line 355.

According to various embodiments of the present disclosure, a memory device, e.g., 120 in FIG. 1A, can be configured to couple to a host, e.g., 110, via a data bus, e.g., 156, and a control bus, e.g., 154. A bank section in the memory device, e.g., 123 in FIG. 1B, can include an array of memory cells, e.g., 130 in FIG. 1A, and sensing circuitry, e.g., 150 in FIG. 1A, coupled to the array via a plurality of sense lines, e.g., 205-1 and 205-2 in FIG. 2 and at corresponding reference numbers in FIGS. 3, 4A and 4B. The sensing circuitry can include a sense amplifier and a compute component, e.g., 206 and 231, respectively, in FIG. 2 and at corresponding reference numbers in FIGS. 3, 4A and 4B, coupled to a sense line and configured to implement operations on pitch with the memory cells of the array, as described herein. A controller, e.g., 140, in the memory device can be configured to couple to the array and sensing circuitry. A shared I/O line (e.g., 155 in FIG. 1C, 355 in FIG. 3, and 455-1 and 455-M in FIGS. 4A and 4B) in the memory device can be configured to couple a source location, e.g., subarray 0 (425-0) in FIGS. 4A and 4B, to a destination location, e.g., subarray N-1 (425-N-1) in FIGS. 4A and 4B, between a pair of bank section locations.

As described herein, the array of memory cells can include an implementation of DRAM memory cells where the controller is configured, in response to a command, to use DRAM logical and electrical interfaces to move data from the source location to the destination location via a shared I/O line. According to various embodiments, the source location can be in a first bank and the destination location can be in a second bank in the memory device and the source location can be in a first subarray of one bank in the memory device and the destination location can be in a second subarray of the same bank. According to various embodiments, the first subarray and the second subarray can be in the same section of the bank or the subarrays can be in different sections of the bank.

According to various embodiments described herein, the apparatus can be configured to move data from a source location, including a particular row (e.g., 319 in FIG. 3) and column address associated with a first number of sense amplifier and compute component, e.g., 406-0 and 431-0, respectively, in subarray 0 (425-0), to a shared I/O line, e.g., 455-1. In addition, the apparatus can be configured to move the data to a destination location, including a particular row and column address associated with a second number of sense amplifier and compute component, e.g., 406-0 and 431-0, respectively, in subarray N-1 (425-N-1), using the shared I/O line, e.g., 455-1. As the reader will appreciate, each shared I/O line, e.g., 455-1, can actually include a complementary pair of shared I/O lines, e.g., shared I/O line and shared I/O line* as shown in the example configuration of FIG. 3. In some embodiments described herein, 2048 shared I/O lines, e.g., complementary pairs of shared I/O lines, can be configured as a 2048 bit wide shared I/O line.

FIGS. 4A and 4B provide another schematic diagram illustrating circuitry for data movement in a memory device in accordance with a number of embodiments of the present disclosure. As illustrated in FIGS. 1B-1C and shown in more detail in FIGS. 4A and 4B, a bank section of a DRAM memory device can include a plurality of subarrays, which are indicated in FIGS. 4A and 4B at 425-0 as subarray 0 and at 425-N-1 as subarray N-1.

FIGS. 4A-4B, which are to be considered as horizontally connected, illustrate that each subarray, e.g., subarray 0 425-0 partly shown in FIG. 4A and partly shown in FIG. 4B, can have a number of associated sense amplifiers 406-0, 406-1, . . . , 406-X-1 and compute components 431-0, 431-1, . . . , 431-X-1. For example, each subarray, 425-0, . . . , 425-N-1, can have one or more associated sensing component stripes (e.g., 124-0, . . . , 124-N in FIG. 1B). According to embodiments described herein, each subarray, 425-0, . . . , 425-N-1, can be split into portions 462-1 (shown in FIG. 4A), 462-2, . . . , 462-M (shown in FIG. 4B). The portions 462-1, . . . , 462-M may be defined by configuring a predetermined number of the sense amplifiers and compute components (e.g., sensing circuitry 150), along with the corresponding columns, e.g., 422-0, 422-1, . . . , 422-7, among columns 422-0, . . . , 422-X-1 to a given shared I/O line, e.g., 455-M. Corresponding pairs of the sense amplifiers and compute components can contribute to formation of the sensing circuitry indicated at 450-0, 450-1, . . . , 450-X-1 in FIGS. 4A-4B.

In some embodiments, as shown in FIGS. 3, 4A and 4B, the predetermined number of the sense amplifiers and compute components, along with the corresponding columns, configured per shared I/O line, can be eight, for example. The number of portions 462-1, 462-2, . . . , 462-M of the subarray can be the same as the number of shared I/O lines 455-1, 455, 2, . . . , 455-M configured to couple to the subarray. The subarrays can be arranged according to various dynamic random access memory (DRAM) architectures for coupling shared I/O lines 455-1, 455, 2, . . . , 455-M between subarrays 425-0, 425-1, . . . , 425-N-1.

For example, portion 462-1 of subarray 0 425-0 in FIG. 4A can correspond to the portion of the subarray illustrated in FIG. 3. As such, sense amplifier 0 406-0 and compute component 0 431-0 can be coupled to column 422-0. As described herein, a column can be configured to include a pair of complementary digit lines referred to as digit line 0 and digit line 0*. However, alternative embodiments can include a single digit line 405-0 (sense line) for a single column of memory cells. Embodiments are not so limited.

As illustrated in FIGS. 1B-1C and shown in more detail in FIGS. 4A-4B, a sensing component stripe can, in various embodiments, extend from one end of a subarray to an opposite end of the subarray. For example, as shown for subarray 0 (425-0), sensing component stripe 0 (424-0, shown schematically above and below DRAM columns in a folded sense line architecture) can include and extend from sense amplifier 0 (406-0) and compute component 0 (431-0) in portion 462-1 to sense amplifier X-1 (406-X-1) and compute component X-1 (431-X-1) in portion 462-M of subarray 0 (425-0).

As described in connection with FIG. 3, the configuration illustrated in FIGS. 4A-4B for the sense amplifiers 406-0, 406-1, . . . , 406-X-1 in combination with the compute components 431-0, 431-1, . . . , 431-X-1 and shared I/O line 0 (455-1) through shared I/O line M-1 (455-M) is not limited to half the combination of the sense amplifiers with the compute components of the sensing circuitry, e.g., 455, being formed above the columns of memory cells and half being formed below the columns of memory cells 422-0, 422-1, . . . , 422-X-1 in a folded DRAM architecture. For example, in various embodiments, a sensing component stripe 424 for a particular subarray 425 can be formed with any number of the sense amplifiers and compute components of the sensing amplifier stripe being formed above and below the columns of memory cells. Accordingly, in some embodiments as illustrated in FIGS. 1B-1C, all of the sense amplifiers and compute components of the sensing circuitry and corresponding sensing amplifier stripes can be formed above or below the columns of memory cells.

As described in connection with FIG. 3, each subarray can have column select circuitry, e.g., 358, that is configured to implement data movement operations on particular columns 422 of a subarray, such as subarray 0 (425-0), and the complementary digit lines thereof, coupling stored data values from the sense amplifiers 406 and/or compute components 431 to given shared I/O lines 455-1, . . . , 455-M, e.g., complementary shared I/O lines 355 in FIG. 3. For example, the controller 140 can direct that data values of memory cells in a particular row, e.g., row 319, of subarray 0 (425-0) be sensed and moved to a same or different numbered row of subarray N-1 (425-N-1) in a same or different numbered column, e.g., different portion of the two subarrays (e.g., not necessarily from portion 462-1 of subarray 0 to portion 462-1 of subarray N-1). For example, in some embodiments data values may be moved from a column in portion 462-1 to a column in portion 462-M using shifting techniques.

The column select circuitry, e.g., 358 in FIG. 3, can direct movement, e.g., sequential movement, of each of, for example, the eight columns, e.g., digit/digit*, in the portion, e.g., 462-1, of the subarray, e.g., 425-0, for a particular row such that the sense amplifiers and compute components of the sensing component stripe, e.g., 424-0, for that portion can store (cache) and move all data values to the shared I/O line in a particular order, e.g., in an order in which the columns were sensed. With complementary digit lines, digit/digit*, and complementary shared I/O lines 355, for each of eight columns, there can be 16 data values (e.g., bits) sequenced to the shared I/O line from one portion of the subarray such that one data value (e.g., bit) is input to each of the complementary shared I/O lines at a time from each of the sense amplifiers and compute components.

As such, with 2048 portions of subarrays each having eight columns (e.g., subarray portion 462-1 of each of subarrays 425-0, 425-1, . . . , 425-N-1), and each configured to couple to a different shared I/O line, e.g., 455-1 through 455-M, 2048 data values (e.g., bits) could be moved to the plurality of shared I/O lines at substantially the same point in time, e.g., in parallel. Accordingly, the present disclosure describes configuring the plurality of shared I/O lines to be at least a thousand bits wide (e.g., 2048 bits wide) to increase the speed, rate, and efficiency of data movement in a DRAM implementation (e.g., relative to a 64 bit wide data path).

As illustrated in FIGS. 4A-4B, in each subarray, e.g., subarray 0 425-0, one or more multiplexers 460-1, 460-2 can be coupled to the sense amplifiers and compute components of each portion 462-1, 462-2, . . . , 462-M of the sensing component stripe 424-0 for the subarray. The multiplexers 460-1, 460-2 can be configured to access, select, receive, coordinate, combine, and transport the data values (e.g., bits) stored (cached) by the number of selected sense amplifiers and compute components in a portion (e.g., portion 462-1) of the subarray to be input to the shared I/O line (e.g., shared I/O line 0 455-1). As such, a shared I/O line, as described herein, can be configured to couple a source location to a destination location between a pair of bank section locations for improved data movement.

According to various embodiments of the present disclosure, a controller, e.g., 140, can be coupled to a bank of a memory device, e.g., 121, to execute a command to move data in the bank from a source location, e.g., subarray 0 425-0, to a destination location, e.g., subarray N-1 425-N-1. A bank section can, in various embodiments, include a plurality of subarrays of memory cells in the bank section, e.g., subarrays 125-0 through 125-N-1 and 425-0 through 425-N-1. The bank section can, in various embodiments, further include sensing circuitry, e.g., 150, coupled to the plurality of subarrays via a plurality of columns, e.g., 322-0 and 422-0 and 422-1, of the memory cells. The sensing circuitry can include a sense amplifier and a compute component, e.g., 206 and 231, respectively, in FIG. 2 and at corresponding reference numbers in FIGS. 3, 4A and 4B, coupled to each of the columns and configured to implement the command to move the data.

The bank section can, in various embodiments, further include a shared I/O line, e.g., 155, 355, and 455-1 and 455-M, to couple the source location and the destination location to move the data. In addition, the controller can be configured to couple to the plurality of subarrays and to the sensing circuitry to perform a data write operation on the moved data to the destination location, e.g., in the bank section.

As such, the controller 140 can be configured to direct writing of the data, moved via the shared I/O lines, to particular memory cells in the destination location, e.g., to memory cells in a particular row of a subarray. Performing a data write operation as such on the moved data can be in addition to the alternative pathway, e.g., as shown in FIG. 1A, of the controller 140 being configured to direct writing of data to the memory array 130, where the data is transferred from the host 110 over the data bus 156 (e.g., a 64 bit wide data bus) via the I/O circuitry 144 and the write circuitry 148.

According to various embodiments, the apparatus can include a sensing component stripe, e.g., 124 and 424, configured to include a number of a plurality of sense amplifiers and compute components that corresponds to a number of the plurality of columns of the memory cells, e.g., where each column of memory cells is configured to couple to a sense amplifier and a compute component. The number of a plurality of sensing component stripes in the bank section, e.g., 424-0 through 424-N-1, can correspond to a number of a plurality of subarrays in the bank section, e.g., 425-0 through 425-N-1.

The number of sense amplifiers and compute components can be configured to be selectably, e.g., sequentially, coupled to the shared I/O line, e.g., as shown by column select circuitry at 358-1, 358-2, 359-1, and 359-2 in FIG. 3. The column select circuitry can be configured to selectably sense data in a particular column of memory cells of a subarray by being selectably coupled to, for example, eight sense amplifiers and compute components in the source location, e.g., as shown in subarray 325 in FIG. 3 and subarray portions 462-1 through 462-M in FIGS. 4A-4B. As such, the eight sense amplifiers and compute components in the source location can be configured to sequentially couple to the shared I/O line. According to the embodiments described herein, a number of shared I/O lines formed in the array can be configured by division of a number of columns in the array by, for example, the eight sense amplifiers and compute components coupled to each of the shared I/O lines. For example, when there are 16,384 columns in the array (e.g., bank section), or in each subarray thereof, and one sense amplifier and compute component per column, 16,384 columns divided by eight yields 2048 shared I/O lines.

The apparatus can, in various embodiments, include a number of multiplexers, e.g., as shown at 460-1 and 460-2 in portions 462-1 through 462-M of various subarrays in FIGS. 4A-4B. As such, according to various embodiments, the apparatus can include a plurality of sense amplifiers and compute components and a multiplexer to select a sense amplifier and a compute component to couple to the shared I/O line. The multiplexers can be formed between the sense amplifiers and compute components and the shared I/O line to access, select, receive, coordinate, combine, and transport selected data to be input to the coupled shared I/O line.

According to various embodiments described herein, an array of memory cells can include a column of memory cells having a pair of complementary sense (digit) lines, e.g., 305-1 and 305-2 in FIG. 3. The sensing circuitry can, in some embodiments, include a sense amplifier, e.g., 306-0, selectably coupled to each of the pair of complementary sense (digit) lines and a compute component, e.g., 331-0, coupled to the sense amplifier via pass gates, e.g., 307-1, 307-2.

According to some embodiments, a source sensing component stripe, e.g., 124 and 424, can include a number of sense amplifiers and compute components that can be selected and configured to send an amount of data, e.g., a number of bits, sensed from a row of the source location in parallel to a plurality of shared I/O lines. For example, in response to control signals for sequential sensing through the column select circuitry, the memory cells of selected columns of a row of the subarray can sense and store (cache) an amount of data, e.g., the number of bits, until that amount reaches a threshold and then send the data via the plurality of shared I/O lines. In some embodiments, the threshold amount of data can correspond to the at least a thousand bit width of the plurality of shared I/O lines.

In some embodiments, the source sensing component stripe can include a number of sense amplifiers and compute components that can be selected and configured to store data, e.g., bits, sensed from a row of the source location when an amount of sensed data, e.g., the number of data bits, exceeds the at least a thousand bit width of the plurality of shared I/O lines. In this embodiment, the source sensing component stripe can be configured to send the data sensed from the row of the source location when coupled to the plurality of shared I/O lines as a plurality of subsets. For example, the amount of at least a first subset of the data can correspond to the at least a thousand bit width of the plurality of shared I/O lines.

The controller can, as described herein, be configured to move the data from a selected row and a selected sense line in the source location to a selected row and a selected sense line in the destination location via the shared I/O line, e.g., in response to control signals from the controller 140. According to various embodiments, a selected row and a selected sense line in the source location (e.g., a first subarray) input to the controller can be different from a selected row and a selected sense line in the destination location (e.g., a second subarray).

As described herein, a location of the data in memory cells of the selected row and the selected sense line in a source subarray can be different from a location of the data moved to memory cells of a selected row and the selected source line in a destination subarray. For example, the source location may be a particular row and digit lines of portion 462-1 of subarray 0 425-0 in FIG. 4A and the destination may be a different row and digit lines of portion 462-M in subarray N-1 425-N-1 in FIG. 4B.

According to embodiments herein, a destination sensing component stripe, e.g., 124 and 424, can be the same as a source sensing component stripe. For example, a plurality of sense amplifiers and compute components can be selected and configured, e.g., depending on the control signal from the controller, to selectably send sensed data to the coupled shared I/O line and selectably receive the data from one of a plurality of coupled shared I/O lines, e.g., to be moved to the destination location. Selection of sense amplifiers and compute components in the destination sensing component stripe can be performed using the column select circuitry described herein, e.g., 358-1, 358-2, 359-1, and 359-2 in FIG. 3.

The controller can, according to some embodiments, be configured to write an amount of data, e.g., a number of data bits, selectably received by the plurality of selected sense amplifiers and compute components in the destination sensing component stripe to a selected row and a selected sense line of the destination location in the destination subarray. In some embodiments, the amount of data to write corresponds to the at least a thousand bit width of a plurality of shared I/O lines.

The destination sensing component stripe can, according to some embodiments, include a plurality of selected sense amplifiers and compute components configured to store received data, e.g., bits, when an amount of received data, e.g., number of data bits, exceeds the at least a thousand bit width of the plurality of shared I/O lines. The controller can, according to some embodiments, be configured to write the stored data, e.g., the number of data bits, to a selected row and a plurality of selected sense lines in the destination location as a plurality of subsets. In some embodiments, the amount of data of at least a first subset of the written data can correspond to the at least a thousand bit width of the plurality of shared I/O lines. According to some embodiments, the controller can be configured to write the stored data, e.g., the number of data bits, to the selected row and the selected sense line in the destination location as a single set, e.g., not as subsets of data.

Embodiments of the present disclosure provide a method to increase a speed, rate, and efficiency of data movement in a PIM array by using an improved data path, e.g., a shared I/O line of a DRAM implementation. According to various embodiments as described herein, a source location and a destination location in a pair of bank locations in a memory device can be configured to couple via a plurality of shared I/O lines. A bank in the memory device can, as described herein, include an array of memory cells, sensing circuitry coupled to the array via a plurality of sense lines, the sensing circuitry including sense amplifiers and compute components configured to implement operations, and a controller coupled to the array and the sensing circuitry.

The method can include receiving a control signal from the controller to move data from the source location to the destination location, e.g., of a DRAM array of the memory cells. The method can further include moving the data from the source location to the destination location, e.g., of the DRAM array, using the sense amplifiers and compute components via the plurality of shared I/O lines.

In some embodiments, the method can include configuring 2048 shared I/O lines as a 2048 bit wide shared I/O line. According to some embodiments, a number of cycles for moving the data from a first row in the source location to a second row in the destination location can be configured by dividing a number of columns in the array intersected by a row of memory cells in the array by the 2048 bit width of the plurality of shared I/O lines. For example, an array, e.g., a bank, a bank section, and a subarray thereof, can have 16,384 columns, which can correspond to 16,384 data values in a row, which when divided by the 2048 bit width of the plurality of shared I/O lines intersecting the row can yield eight cycles, each separate cycle being at substantially the same point in time, e.g., in parallel, for movement of all the data in the row. Alternatively or in addition, a bandwidth for moving the data from a first row in the source location to a second row in the destination location can be configuring by dividing the number of columns in the array intersected by the row of memory cells in the array by the 2048 bit width of the plurality of shared I/O lines and multiplying the result by a clock rate of the controller. In some embodiments, determining a number of data values in a row of the array can be based upon the plurality of sense (digit) lines in the array.

A source location in a first subarray of memory cells can be configured to couple via a plurality of shared I/O lines to a destination location in a second subarray of memory cells, where the plurality of shared I/O lines can be configured as at least a thousand bit wide shared I/O line. The method can include configuring a first sensing component stripe, e.g., 424-0, for the first subarray, e.g., 425-0, and second sensing component stripe, e.g., 424-N-1, for second subarray, e.g., 425-N-1, to include a sense amplifier and a compute component, e.g., 406-0 and 431-0, respectively, coupled to each corresponding column of memory cells in the first and second subarrays, e.g., 422-0 through 422-X-1. A controller can be configured to couple to the memory cells of the first and second subarrays and the first and second sensing component stripes, e.g., via the column select circuitry 358-1, 358-2, 359-1, and 359-2.

The method can include moving the data from the source location in the first subarray via the plurality of shared I/O lines to the destination location in the second subarray using the first sensing component stripe for the first subarray and the second sensing component stripe for the second subarray. The first amplifier stripe for the first subarray and the second sensing component stripe for the second subarray can, accordingly to various embodiment, be configured to couple to the plurality of shared I/O lines, e.g., via the column select circuitry 358-1, 358-2, 359-1, and 359-2 in FIG. 3 and the multiplexers 460-1 and 460-2 in FIGS. 4A-4B.

According to some embodiments, the source location in the first subarray and the destination location in the second subarray can be in a single bank section of a memory device, e.g., as shown in FIGS. 1B-1C and FIGS. 4A-4B. Alternatively or in addition, the source location in the first subarray and the destination location in the second subarray can be in separate banks and bank sections of the memory device coupled to a plurality of shared I/O lines. In some embodiments, movement of data between two separate banks can include a number of intermediate registers (not shown) coupled to the plurality of shared I/O lines between the two banks in order to temporarily hold, e.g., to perform cache and/or data buffering functions, the moved data. Temporarily holding the moved data as such may resolve timing issues, e.g., with control signals, synchronization of data movement, etc., with movement of the data between the two banks using the shared I/O lines. As such, the method can include moving the data, e.g., in parallel, from the first sensing component stripe for the first subarray via the plurality of shared I/O lines to the second sensing component stripe for the second subarray.

The method can, according to various embodiments, include configuring a sensing component stripe, e.g., all sensing component stripes 424-0 through 424-N-1, in each of a plurality of subarrays, e.g., subarrays 425-0 through 425-N-1, to couple to the plurality of shared I/O lines, e.g., shared I/O line 455-1. In some embodiments, the method can include coupling only one of a plurality, e.g., two, four, eight, sixteen, etc., including odd numbers, of columns of complementary sense lines at a time in the first subarray to one of the plurality of shared I/O lines using the first sensing component stripe, e.g., sensing component stripe 424-0, and coupling only one of a plurality, e.g., two, four, eight, sixteen, etc., including odd numbers, of columns of complementary sense lines at a time in the second sub array to one of the plurality of shared I/O lines using the second sensing component stripe, e.g., sensing component stripes 424-N-1.

The method can include moving the data from a number of sense amplifiers and compute components of the first sensing component stripe via the plurality of shared I/O lines to a corresponding number of sense amplifiers and compute components of the second sensing component stripe. For example, the data sensed from each sense amplifier and compute component of the source location can be moved to a corresponding sense amplifier and compute component in the destination location.

According to various embodiments, the method can include the controller selecting, e.g., opening, a first row of memory cells, which corresponds to the source location, for the first sensing component stripe to sense data stored therein, coupling, e.g., opening, the plurality of shared I/O lines to the first sensing component stripe, and coupling, e.g., opening, the second sensing component stripe to the plurality of shared I/O lines, e.g., via the column select circuitry 358-1, 358-2, 359-1, and 359-2 and the multiplexers 460-1 and 460-2. As such, the method can include moving the data in parallel from the first sensing component stripe to the second sensing component stripe via the plurality of shared I/O lines. The method can include the first sensing component stripe storing, e.g., caching, the sensed data and the second sensing component stripe storing, e.g., caching, the moved data.

The method can include the controller selecting, e.g., opening, a second row of memory cells, which corresponds to the destination location, for the second sensing component stripe, e.g., via the column select circuitry 358-1, 358-2, 359-1, and 359-2 and the multiplexers 460-1 and 460-2. The controller can then direct writing the data moved to the second sensing component stripe to the destination location in the second row of memory cells.

In a DRAM implementation, a shared I/O line can be used as a data path to move data in the memory cell array between various locations, e.g., subarrays, in the array. The shared I/O line can be shared between all sensing component stripes. In various embodiments, one sensing component stripe or one pair of sensing component stripes, e.g., coupling a source location and a destination location, can communicate with the shared I/O line at any given time. The shared I/O line is used to accomplish moving the data from one sensing component stripe to the other sensing component stripe. A row in the first sensing component stripe can be opened and the data values of the memory cells in the row can be sensed. After sensing, the first sensing component stripe can be opened to the shared I/O line, along with opening the second sensing component stripe to the same shared I/O line. The second sensing component stripe can still be in a pre-charge state, e.g., ready to accept data. After the data from the first sensing component stripe has been moved, e.g., driven, into the second sensing component stripe, the second sensing component stripe can fire, e.g., latch, the data into respective sense amplifiers and compute components. A row coupled to the second sensing component stripe can be opened, e.g., after latching the data, and the data that resides in the sense amplifiers and compute components can be written into the destination location of that row.

Figure 5:
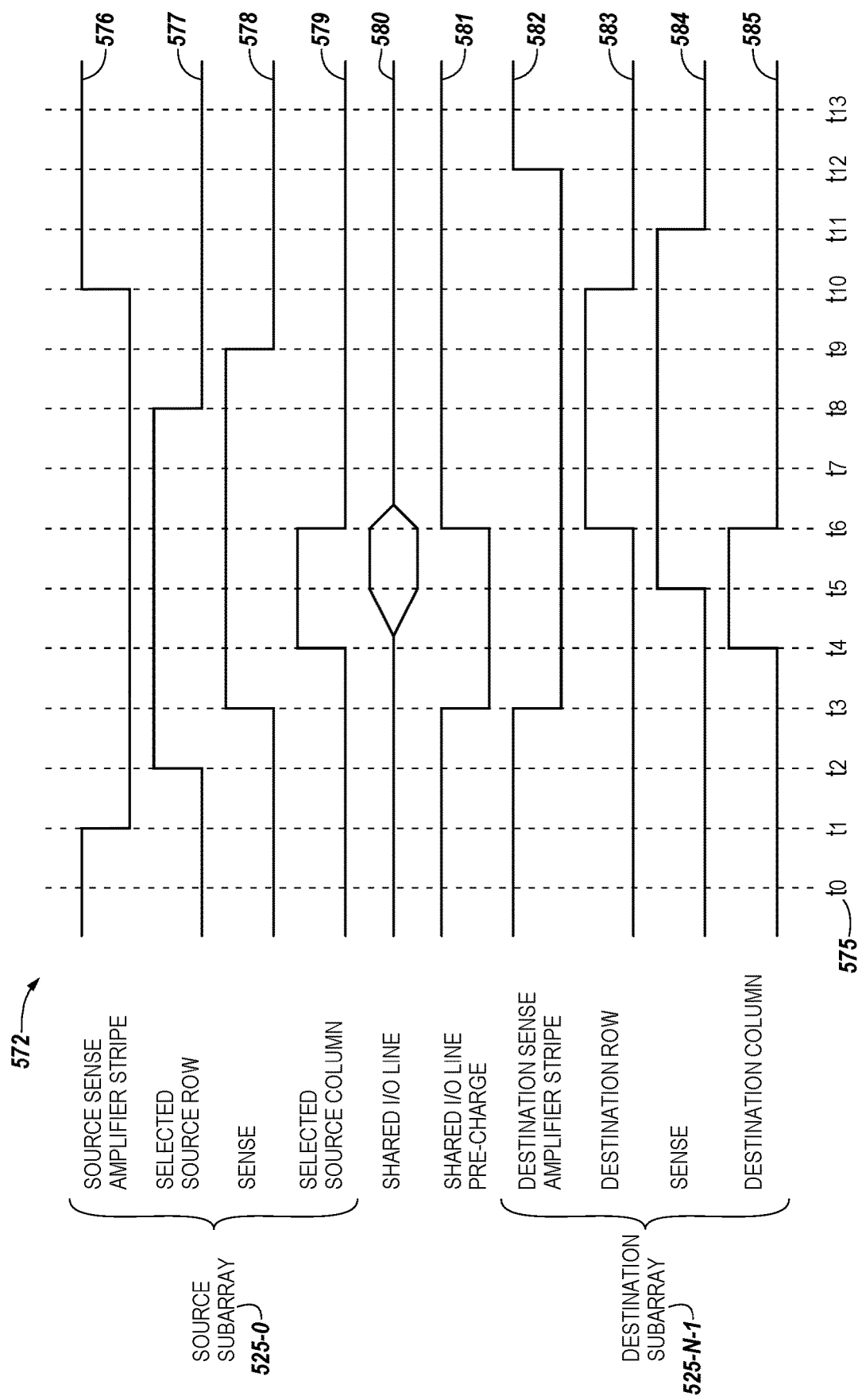
FIG. 5 illustrates a timing diagram associated with performing a number of data movement operations using circuitry in accordance with a number of embodiments of the present disclosure.

FIG. 5 illustrates a timing diagram 572 associated with performing a number of data movement operations using circuitry in accordance with a number of embodiments of the present disclosure. The timing diagram 572 schematically illustrated in FIG. 5 is shown as an example of a sequence of signals in circuitry to enable movement of data, as described herein. A time scale 575 horizontally demarcated in signaling units ($t_0$, $t_1$, $t_2$, ..., $t_{13}$) of arbitrary length is shown by way of example.

According to various embodiments of the present disclosure, a controller, e.g., 140 in FIGS. 1A-1C, can be configured to couple to one or more banks and bank sections of a memory device, e.g., 121/123 in FIGS. 1B-1C, to execute a command to move data from a source subarray, e.g., a source subarray 425-0 and 525-0, to a destination subarray, e.g., a destination subarray 425-N-1 and 525-N-1.

As such, at $t_1$ the controller can provide a signal to enable a pre-charge of the source sensing component stripe 576 of the source subarray 525-0 to be driven low to enable, e.g., fire, the source sensing component stripe to read and store sensed data. A signal can be input at $t_2$ to the selected source row 577 to enable a read (sense) of the data values in the memory cells of the row by the row being driven to high. A signal can be input at $t_3$ to the sense circuitry 578, e.g., sense amplifiers and compute components, associated with the source sensing component stripe to enable sensing of the data values in the memory cells of the row by the sense circuitry being driven to high. A signal can be input at $t_4$ to the selected source columns 579 to enable a read (sense) of the data values in the memory cells of the selected source columns of the row by the columns being driven to high.

According to various embodiments, at $t_3$ the controller can provide a signal to enable a pre-charge of a number of shared I/O lines 581 to couple a number of shared I/O lines with the source sensing component stripe of the source subarray by being driven low. Between around $t_4$ through $t_5$, the sensed data can be conducted through the number of shared I/O lines 580 so as to be accessible by components of the destination subarray 525-N-1. For example, as described herein, the data from sequentially selected columns, e.g., columns 1 through 8, configured to be coupled to each of the number of shared I/O lines can be sequentially sent through the coupled number of shared I/O lines during the time period from around $t_4$ through $t_5$. In some embodiments, as shown at 580, the data conducted through the number of shared I/O lines can include data sensed from complementary sense lines.

The controller can provide a signal at $t_3$ to enable a pre-charge of the destination sensing component stripe 582 of the destination subarray 525-N-1 to be driven low to enable, e.g., fire, the destination sensing component stripe to receive and store moved data by being coupled to the number of shared I/O lines 580. A signal can be input at $t_4$ to the selected destination columns 585 to enable movement of the data values to the sense circuitry 584, e.g., sense amplifiers and compute components, associated with the destination sensing component stripe for the selected columns by the selected destination columns being driven to high. A signal can be input at $t_5$ to latch the data moved to the destination sensing component stripe to be stored in the sense circuitry 584, e.g., sense amplifiers and compute components, associated with the source sensing component stripe by the sense circuitry being driven to high. A signal can be input at $t_6$ to the selected destination row 583 to enable the data stored in the sense circuitry to be moved and written to selected memory cells thereof by being driven to high.

Various time frames can be implemented for signal conduction pathways to remain enabled, e.g., opened, before a signal is provided to disable, e.g., close, the signal conduction pathways. According to some embodiments, the data stored in the sense circuitry 584, e.g., sense amplifiers and compute components, by the sense circuitry being driven to high at $t_5$ can remain accessible to the selected destination row 583 until a signal is input at $t_{11}$ to disable the signal conduction pathway by being driven to low. As such, the signal conduction pathway for the sense circuitry 584 can be open from $t_5$ through $t_{11}$, which encompasses the time frame from $t_6$ through $t_{10}$ during which the signal conduction pathway for the selected destination row is open.

According to various embodiments of the present disclosure, a source row of a source subarray, e.g., any one of 512 rows, can be different from, e.g., need not match, a destination row of a destination subarray, where the source and destination subarrays can, in various embodiments, be in the same or different banks and bank sections of memory cells. Moreover, a selected source column, e.g., any one of eight configured to be coupled to a particular shared I/O line, can be different from, e.g., need not match, a selected destination column of a destination subarray.

While example embodiments including various combinations and configurations of sensing circuitry, sense amplifiers, compute components, sensing component stripes, shared I/O lines, column select circuitry, multiplexers, signal timing sequences, etc., have been illustrated and described herein, embodiments of the present disclosure are not limited to those combinations explicitly recited herein. Other combinations and configurations of the sensing circuitry, sense amplifiers, compute components, sensing component stripes, shared I/O lines, column select circuitry, multiplexers, signal timing sequences, etc., disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a memory device, comprising:
   receiving control signals that direct movement of data from a source location to a destination location in the memory device;
   coupling the source location and the destination location via a plurality of I/O lines shared by the source location and the destination location;
   wherein the memory device comprises:
      an array of memory cells; and
      sensing circuitry coupled to the array via a plurality of sense lines, the sensing circuitry including sense amplifiers and compute components configured to implement operations;
   determining a number of cycles for moving the data from a first row in the source location to a second row in the destination location by dividing a number of columns in the array intersected by a row of memory cells in the array by at least a thousand bit width of the plurality of I/O lines; and
   moving the data from the source location to the destination location, using the sense amplifiers and compute components, via the plurality of I/O lines.

2. The method of claim 1, wherein the method further comprises:
   receiving the control signals to move the data from the source location to the destination location of a dynamic random access memory (DRAM) array; and
   moving the data from the source location to the destination location of the DRAM array.

3. A method for operating a memory device, comprising:
   coupling, via a plurality of I/O lines, a first sensing component stripe for a first subarray of memory cells to a second sensing component stripe for a second subarray of memory cells; and
   moving data from a source location in the first subarray, via the plurality of I/O lines, to a destination location in the second subarray using the first sensing component stripe and the second sensing component stripe;
   wherein:
      the plurality of I/O lines is configured to be shared by the first sensing component stripe and the second sensing component stripe as at least a thousand bit wide I/O line; and
      the first and second sensing component stripes include a sense amplifier and a compute component coupled to each corresponding column of memory cells in the first and second subarrays.

4. The method of claim 3, wherein the method further comprises coupling the first sensing component stripe and the second sensing component stripe to the plurality of I/O lines.

5. The method of claim 3, wherein the method further comprises moving the data from the source location in the first subarray to the destination location in the second subarray in a single bank of the memory device.

6. The method of claim 3, wherein the method further comprises moving the data from the first sensing component stripe via the plurality of I/O lines to the second sensing component stripe.

7. The method of claim 3, wherein the method further comprises selectably coupling a sensing component stripe in each of a plurality of subarrays to the plurality of I/O lines.

8. The method of claim 3, wherein the method further comprises:
   coupling only one of a plurality of columns of complementary sense lines at a time in the first subarray to one of the plurality of I/O lines using the first sensing component stripe; and
   coupling only one of a plurality of columns of complementary sense lines at a time in the second subarray to one of the plurality of I/O lines using the second sensing component stripe.

9. The method of claim 3, wherein the method further comprises moving the data from a number of sense amplifiers and compute components of the first sensing component stripe via the plurality of I/O lines to a corresponding number of sense amplifiers and compute components of the second sensing component stripe.

10. The method of claim 3, wherein the method further comprises a controller:
    selecting a first row of memory cells, which corresponds to the source location, for the first sensing component stripe to sense data stored therein;
    coupling the plurality of I/O lines to the first sensing component stripe;
    coupling the second sensing component stripe to the plurality of I/O lines; and
    moving the data in parallel from the first sensing component stripe to the second sensing component stripe via the plurality of I/O lines.

11. The method of claim 10, wherein the method further comprises:
    storing the sensed data in the first sensing component stripe; and
    storing the moved data in the second sensing component stripe.

12. The method of claim 10, wherein the method further comprises a controller:
    selecting a second row of memory cells, which corresponds to the destination location, for the second sensing component stripe; and
    directing writing of the data moved to the second sensing component stripe to the destination location in the second row of memory cells.

13. An apparatus, comprising:
an array of memory cells;
sensing circuitry coupled to the array via a plurality of sense lines, the sensing circuitry including sense amplifiers and compute components configured to implement operations;
a plurality of I/O lines selectably shared by a source location and a destination location; and
a controller coupled to the array and the sensing circuitry and configured to:
receive control signals to direct movement of data from the source location to the destination location;
select a first row of memory cells, which corresponds to the source location, for a first sensing component stripe to sense data stored therein;
direct coupling of the source location and the destination location via the plurality of I/O lines, including:
directing coupling of the plurality of I/O lines to the first sensing component stripe; and
directing coupling of the second sensing component stripe to the plurality of I/O lines; and
direct movement of the data from the source location to the destination location, using the sense amplifiers and compute components, via the plurality of I/O lines, including directing movement of the data in parallel from the first sensing component stripe to a second sensing component stripe via the plurality of I/O lines.

14. The apparatus of claim 13, wherein:
the array is a dynamic random access memory (DRAM) array;
the control signals are received to move the data from the source location to the destination location of the DRAM; and
the controller directs the movement of the data from the source location to the destination location of the DRAM array.

15. The apparatus of claim 13, wherein:
the first sensing component stripe stores the sensed data; and
the second sensing component stripe stores the moved data.

16. The apparatus of claim 13, wherein the controller is further configured to:
select a second row of memory cells, which corresponds to the destination location, for the second sensing component stripe; and
direct the data moved to the second sensing component stripe to be written to the destination location in the second row of memory cells.

17. A method for operating a memory device, comprising:
receiving control signals that direct movement of data from a source location to a destination location in the memory device;
coupling the source location and the destination location via a plurality of I/O lines shared by the source location and the destination location;
wherein the memory device comprises:
an array of memory cells; and
sensing circuitry coupled to the array via a plurality of sense lines, the sensing circuitry including sense amplifiers and compute components configured to implement operations;
configuring a bandwidth for moving the data from a first row in the source location to a second row in the destination location by:
dividing a number of columns in the array intersected by a row of memory cells in the array by at least a thousand bit width of the plurality of I/O lines; and
multiplying the result by a clock rate of a controller coupled to the array and the sensing circuitry; and
moving the data from the source location to the destination location, using the sense amplifiers and compute components, via the plurality of I/O lines.

18. An apparatus, comprising:
an array of memory cells;
sensing circuitry coupled to the array via a plurality of sense lines, the sensing circuitry including sense amplifiers and compute components configured to implement operations;
a plurality of I/O lines selectably shared by a source location and a destination location;
a first sensing component stripe for a first subarray of memory cells configured to be coupled, via the plurality of I/O lines as directed by a controller, to a second sensing component stripe for a second subarray of memory cells;
the first and second sensing component stripes include a sense amplifier and a compute component coupled to each corresponding column of memory cells in the first and second subarrays; and
the controller coupled to the array and the sensing circuitry and configured to:
receive control signals to direct movement of data from the source location to the destination location;
direct coupling of the source location and the destination location via the plurality of I/O lines; and
direct movement of the data from the source location in the first subarray, via the plurality of I/O lines, to the destination location in the second subarray using the first sensing component stripe for the first subarray and the second sensing component stripe for the second subarray;
wherein the plurality of I/O lines is configured to be shared by the first sensing component stripe and the second sensing component stripe as at least a thousand bit wide I/O line.

* * * * *